(12) United States Patent
Melik-Martirosian et al.

(10) Patent No.: US 9,741,768 B1
(45) Date of Patent: Aug. 22, 2017

(54) CONTROLLING MEMORY CELL SIZE IN THREE DIMENSIONAL NONVOLATILE MEMORY

(71) Applicant: SanDisk Technologies Inc., Plano, TX (US)

(72) Inventors: Ashot Melik-Martirosian, San Jose, CA (US); Juan Saenz, Menlo Park, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/087,980

(22) Filed: Mar. 31, 2016

(51) Int. Cl.
*H01L 27/11521* (2017.01)
*H01L 27/24* (2006.01)
*H01L 45/00* (2006.01)
*H01L 21/02* (2006.01)

(52) U.S. Cl.
CPC ...... *H01L 27/249* (2013.01); *H01L 21/02491* (2013.01); *H01L 27/11521* (2013.01); *H01L 27/2454* (2013.01); *H01L 45/085* (2013.01); *H01L 45/1233* (2013.01); *H01L 45/1266* (2013.01); *H01L 45/145* (2013.01); *H01L 45/1608* (2013.01)

(58) Field of Classification Search
CPC ......... H01L 21/02365; H01L 21/02436; H01L 21/02518; H01L 21/70; H01L 21/702
See application file for complete search history.

(56) References Cited

U.S. PATENT DOCUMENTS

| | | | |
|---|---|---|---|
| 2013/0153846 A1 | 6/2013 | Chien et al. | |
| 2014/0061574 A1* | 3/2014 | Pio | H01L 27/10 257/5 |
| 2014/0248763 A1* | 9/2014 | Konevecki | H01L 21/28008 438/591 |
| 2015/0333103 A1 | 11/2015 | Toh et al. | |

OTHER PUBLICATIONS

International Search Report and Written Opinion dated May 26, 2017 in International Patent Application No. PCT/US2017/017626.

* cited by examiner

*Primary Examiner* — Cheung Lee
(74) *Attorney, Agent, or Firm* — Vierra Magen Marcus LLP

(57) ABSTRACT

A method is provided that includes forming a vertical bit line disposed in a first direction above a substrate, forming a multi-layer word line disposed in a second direction above the substrate, the second direction perpendicular to the first direction, and forming a memory cell including a nonvolatile memory material at an intersection of the vertical bit line and the multi-layer word line. The multi-layer word line includes a first conductive material layer and a second conductive material layer disposed above the first conductive material layer. The memory cell includes a working cell area encompassed by an intersection of the first conductive material layer and the nonvolatile memory material.

17 Claims, 36 Drawing Sheets

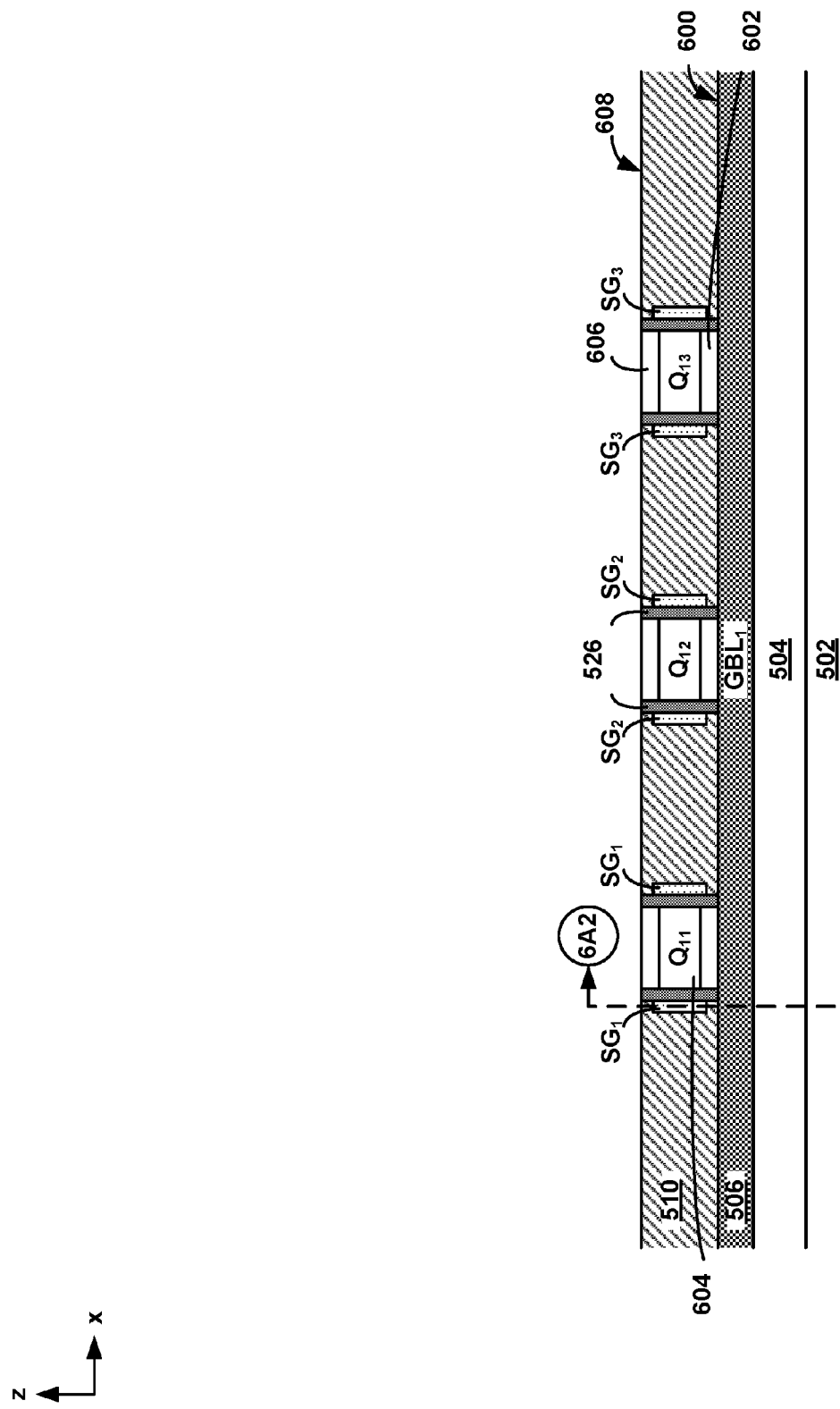
FIG. 6A1

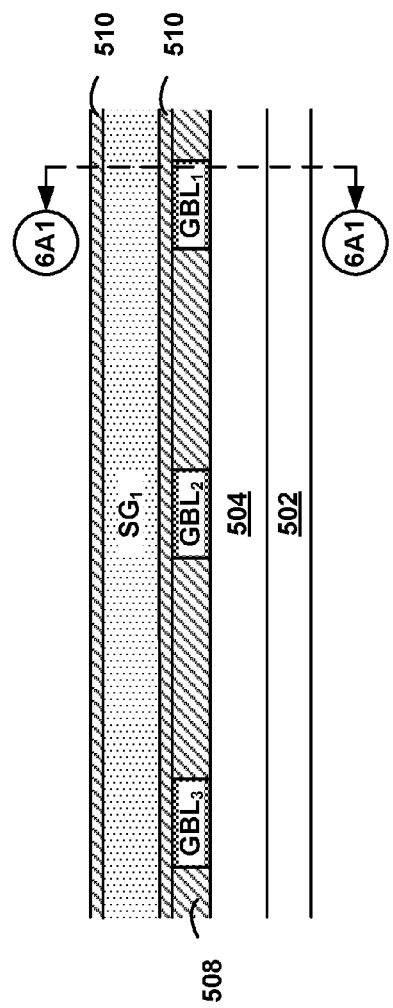
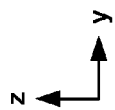
FIG. 6A2

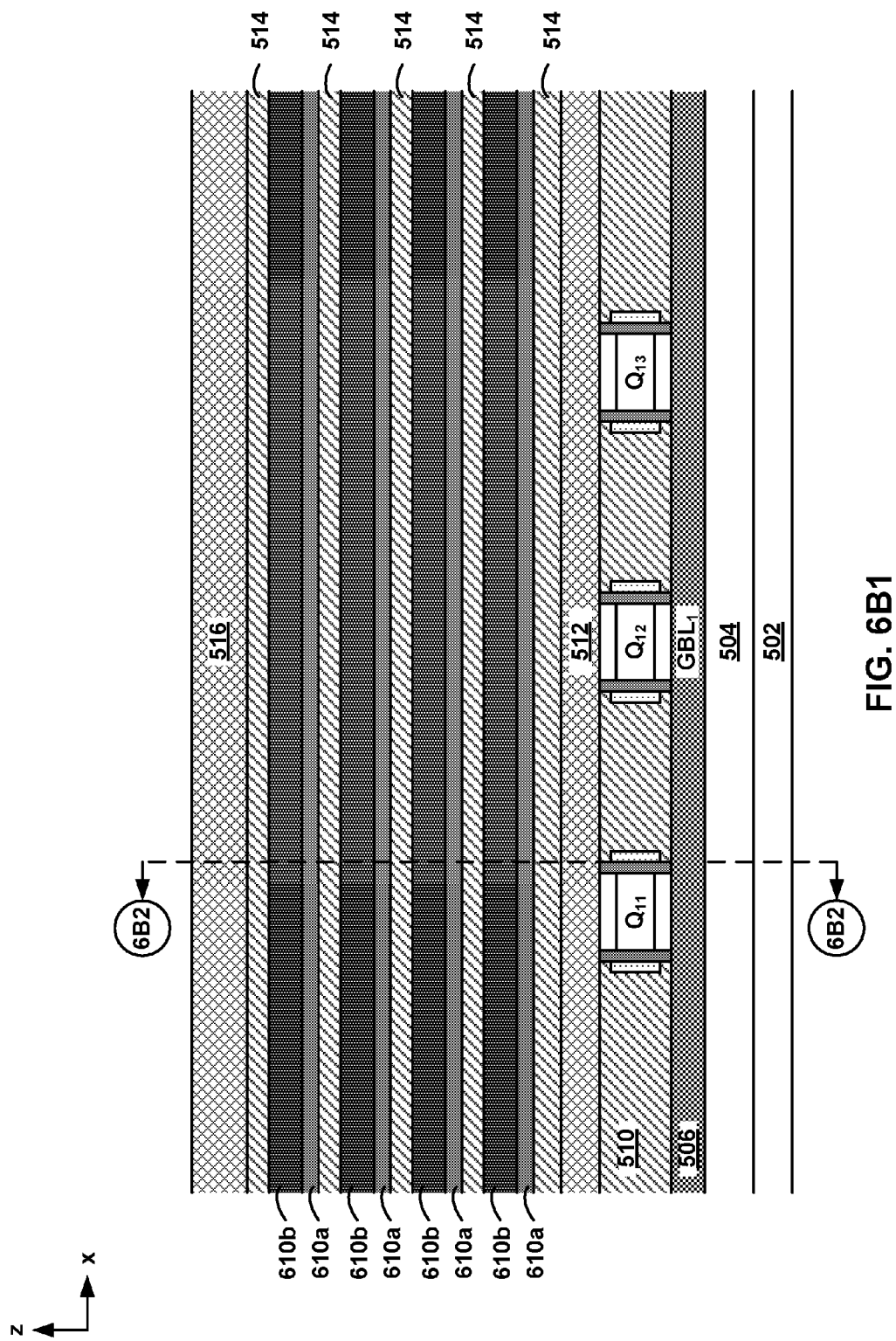
FIG. 6B1

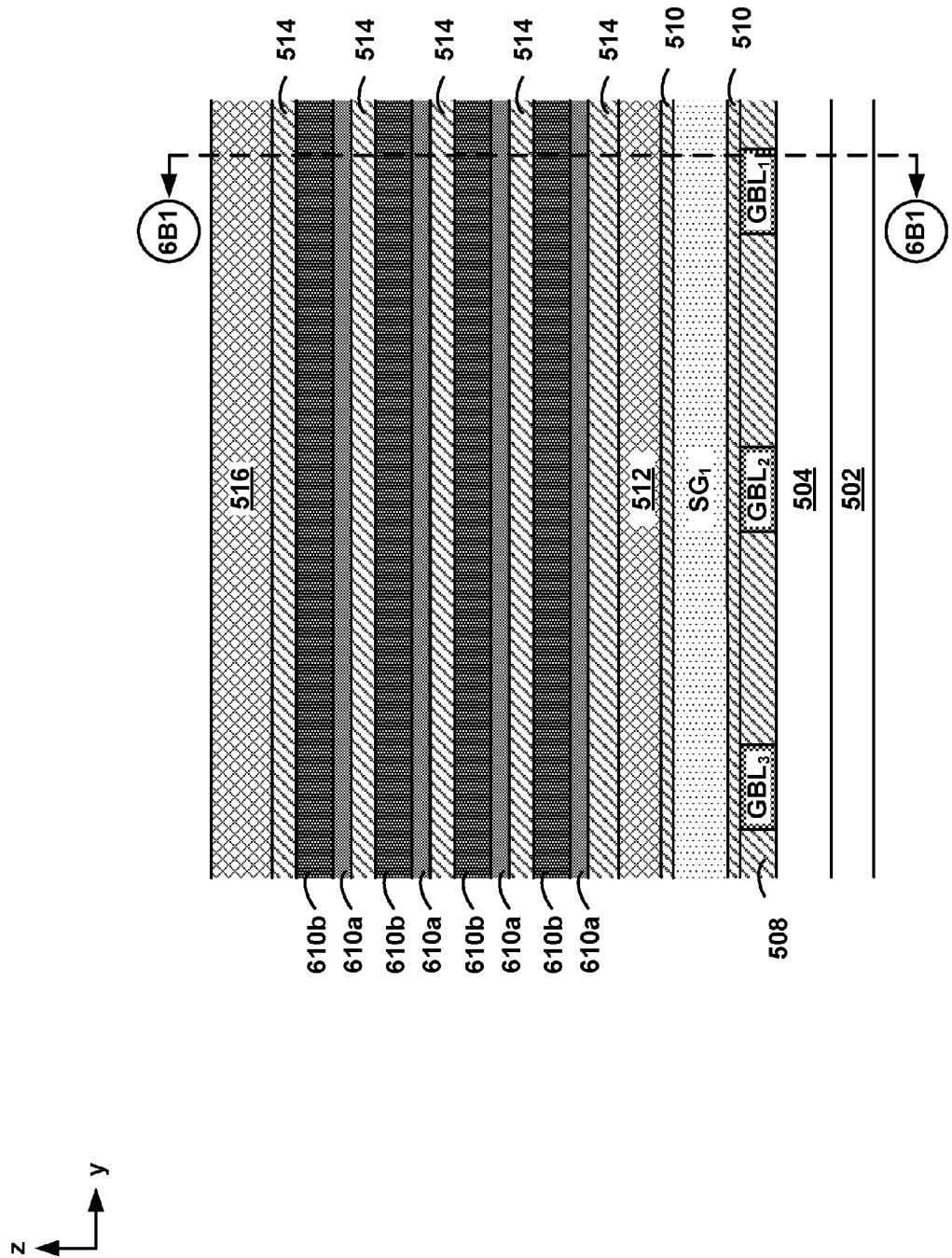
FIG. 6B2

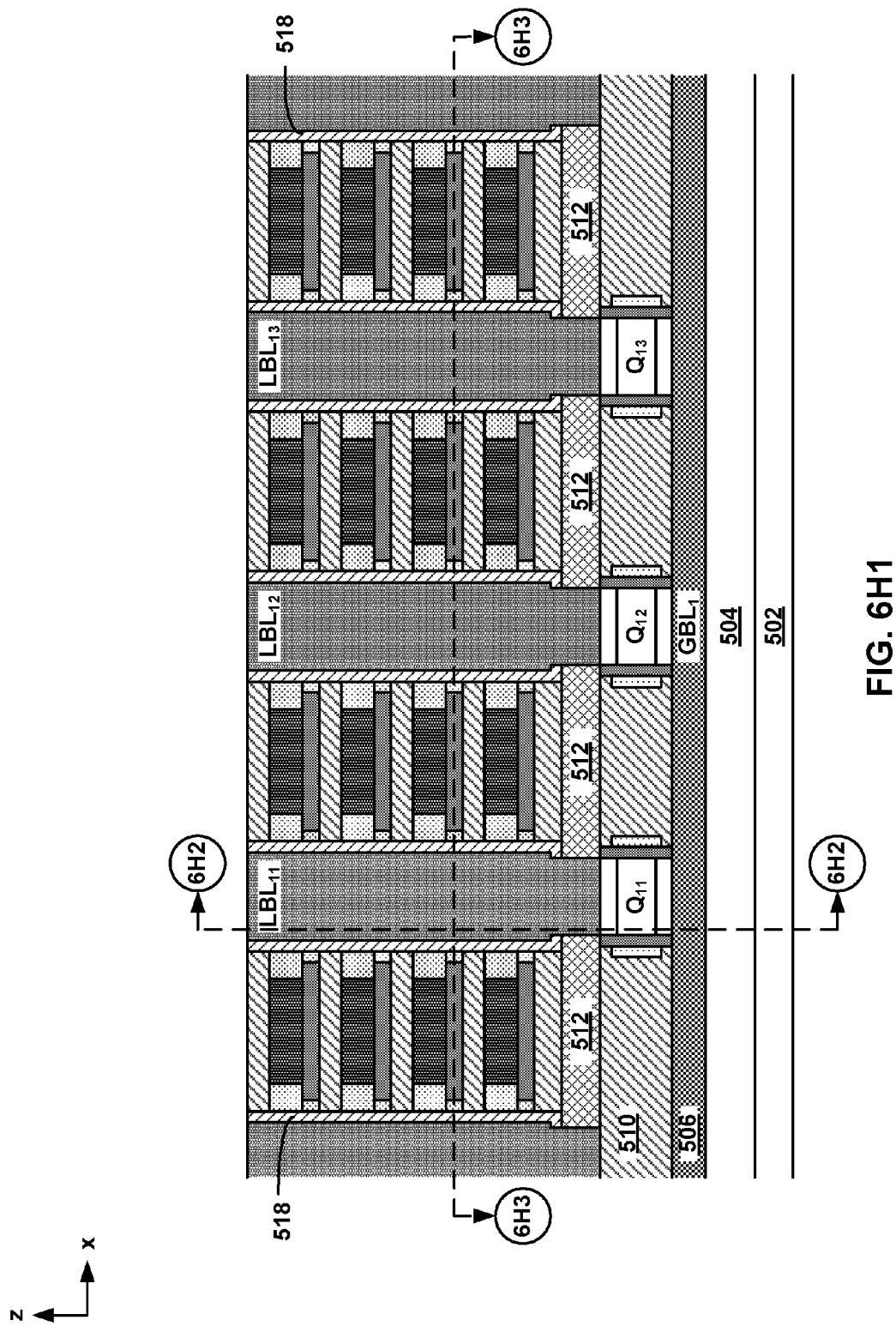
FIG. 6H1

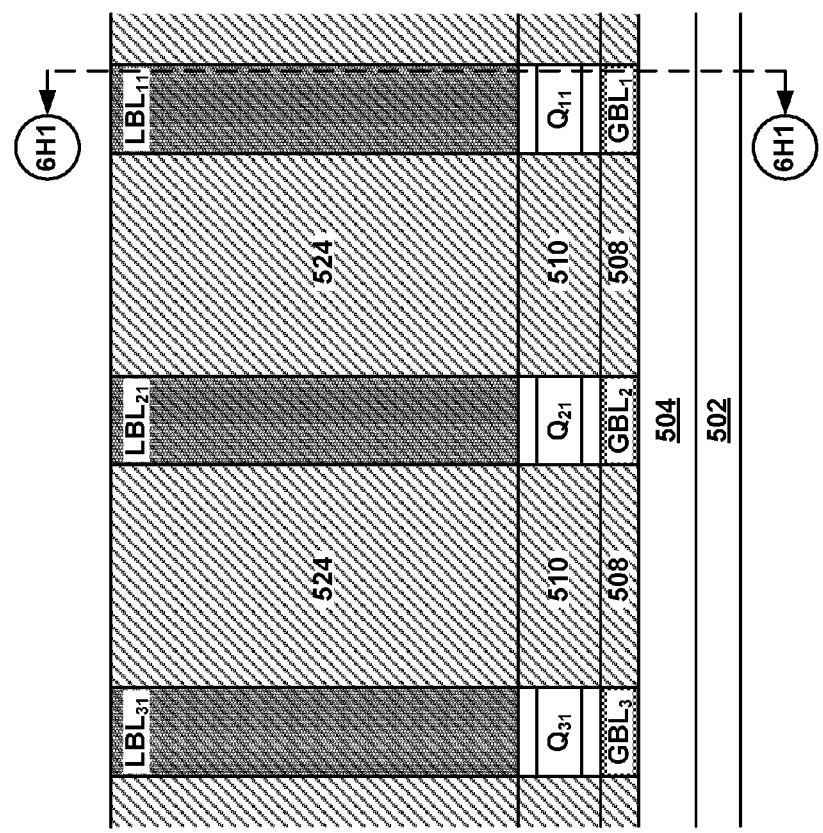
FIG. 6H2

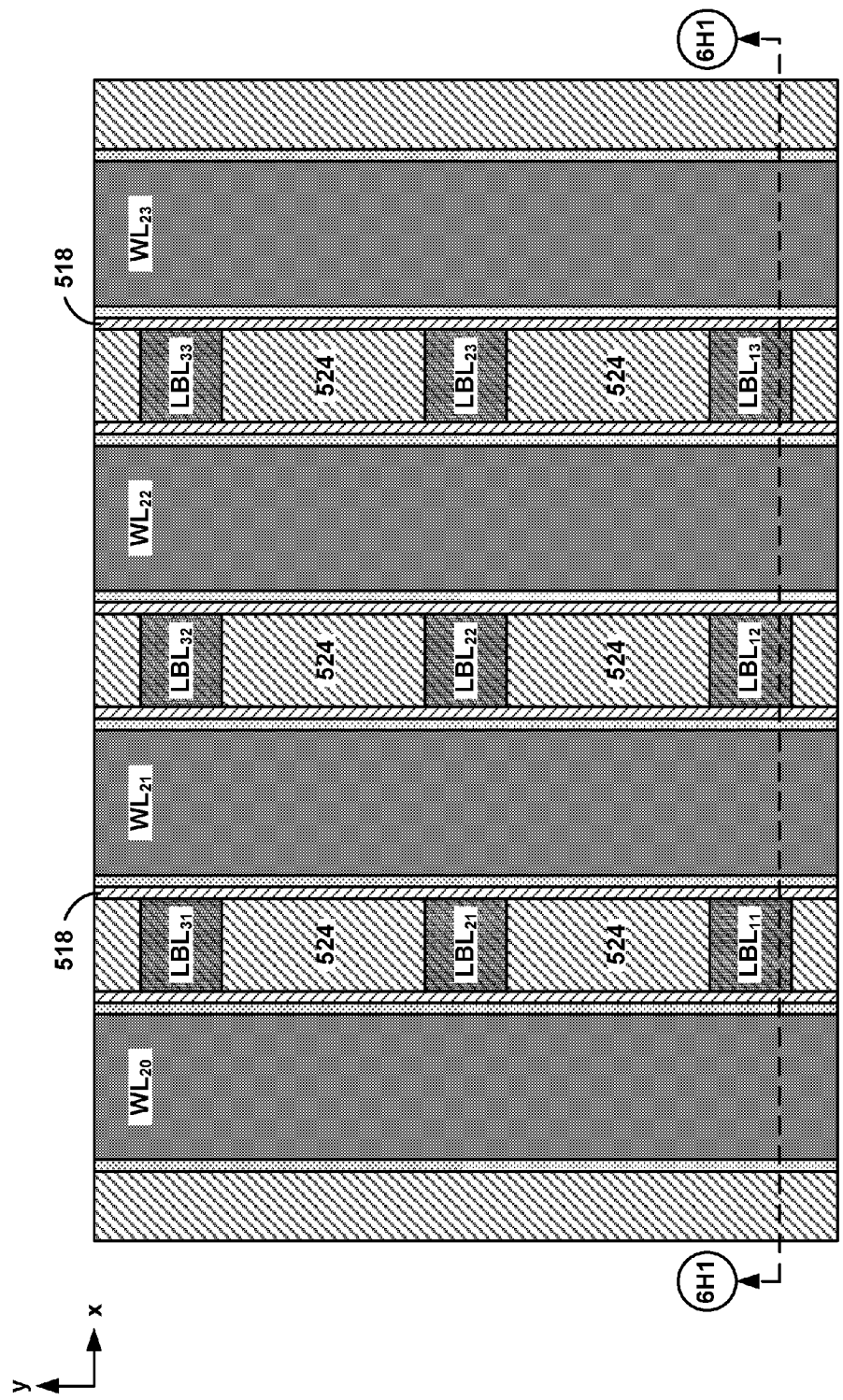
FIG. 6H3

CONTROLLING MEMORY CELL SIZE IN THREE DIMENSIONAL NONVOLATILE MEMORY

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to either a low resistance state or a high resistance state. The memory cells may be individually connected between first and second conductors (e.g., a bit line electrode and a word line electrode). The state of such a memory cell is typically changed by proper voltages being placed on the first and second conductors.

Some reversible resistance-switching memory elements may be in the high resistance state when first fabricated. The term "FORMING" is used to describe putting the reversible resistance-switching memory elements into a lower resistance state for the first time after fabrication. After a FORMING operation is performed, the reversible resistance-switching memory elements may be reversibly switched between a high resistance state and a low resistance state.

One theory that is used to explain the FORMING mechanism, as well as the reversible resistance-switching mechanism is that one or more conductive filaments are formed by the application of a voltage to the reversible resistance-switching memory elements. One example of a reversible resistance-switching memory element includes a metal oxide as the reversible resistance-switching memory material disposed between the first and second conductors.

In response to a suitable voltage between the first and second conductors, one or more conductive filaments form in the metal oxide, resulting in one or more conductive paths between the first and second conductors of the reversible resistance-switching memory element. The conductive filaments lower the resistance of the reversible resistance-switching memory element. Application of another voltage between the first and second conductors ruptures the conductive filaments, thereby increasing the resistance of the reversible resistance-switching memory element. Application of still another voltage between the first and second conductors repairs the rupture in the conductive filaments, once again decreasing the resistance of the reversible resistance-switching memory element.

The initial formation of the conductive filaments may be referred to as "FORMING." The rupture of the filaments may be referred to as RESETTING, which puts the reversible resistance-switching memory element in a high resistance (RESET) state. The repair of the rupture of the filaments may be referred to as SETTING, which puts the reversible resistance-switching memory element in a low resistance (SET) state. After completing the FORMING process, the reversible resistance-switching memory element may be repeatedly switched between the SET and RESET states by repeatedly RESETTING and SETTING the reversible resistance-switching memory element. Data values may then be assigned to the high resistance RESET state and the low resistance SET state.

The FORMING process may impact the ability of the reversible resistance-switching memory element to exhibit proper switching behavior over time. For example, the reversible resistance-switching memory element may switch consistently between the high resistance state and the low resistance state in response to appropriate voltages, which may be referred to as "switching within the intended window."

BRIEF DESCRIPTION OF THE DRAWINGS

FIGS. 6A1-6H3 are cross-sectional views of a portion of a substrate during an example fabrication of the monolithic three-dimensional memory array of FIGS. 5A-5F.

DETAILED DESCRIPTION

Figure 1A:
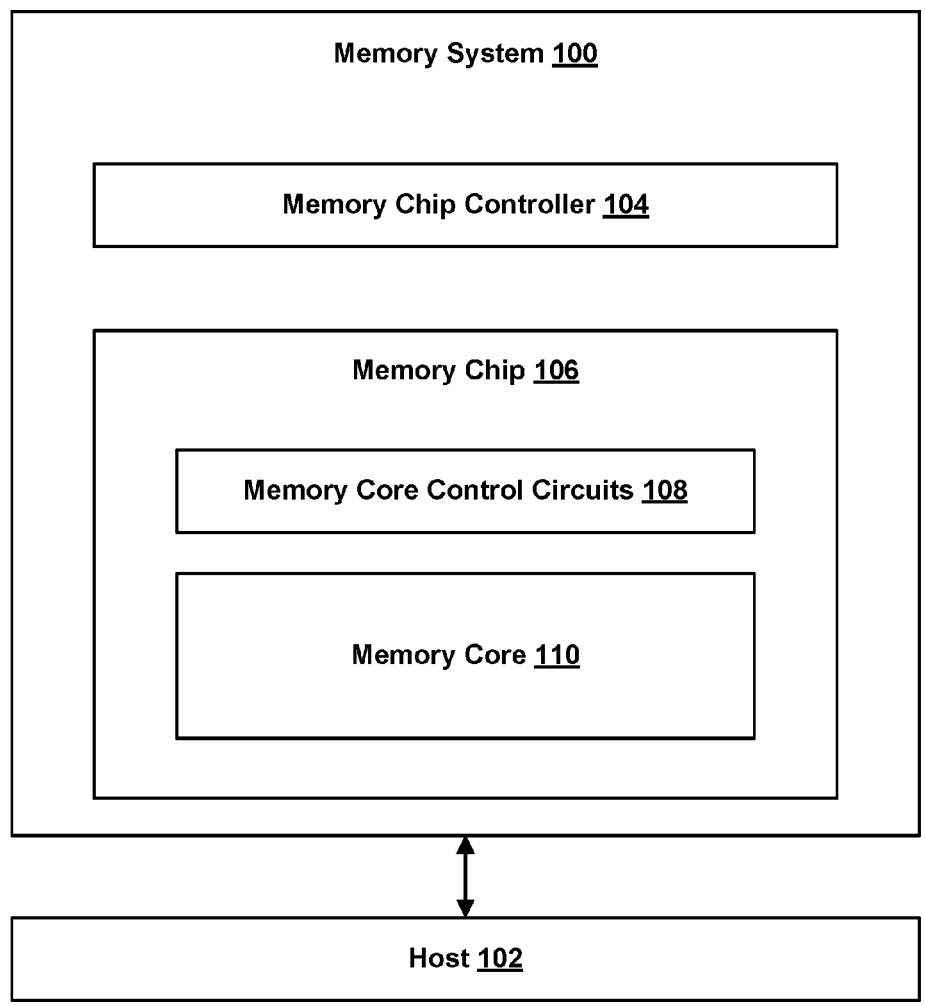
FIG. 1A depicts an embodiment of a memory system and a host.

Technology is described for controlling a size of a non-volatile memory cell, such as a reversible resistance-switching memory cell. The memory cell is disposed between a multi-layer word line and a vertical bit line. The multi-layer word line includes a first conductive material layer and a second conductive material layer disposed above the first conductive material layer. The memory cell includes a working cell area encompassed by an intersection of the first conductive material layer and the nonvolatile memory material. By making a height of the first conductive material layer smaller than a height of the second conductive material layer, the working cell are of the memory cell can be reduced.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element, such as a phase change material, a ferroelectric material, or a metal oxide (e.g., hafnium oxide), disposed between first and second conductors. In some cases, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
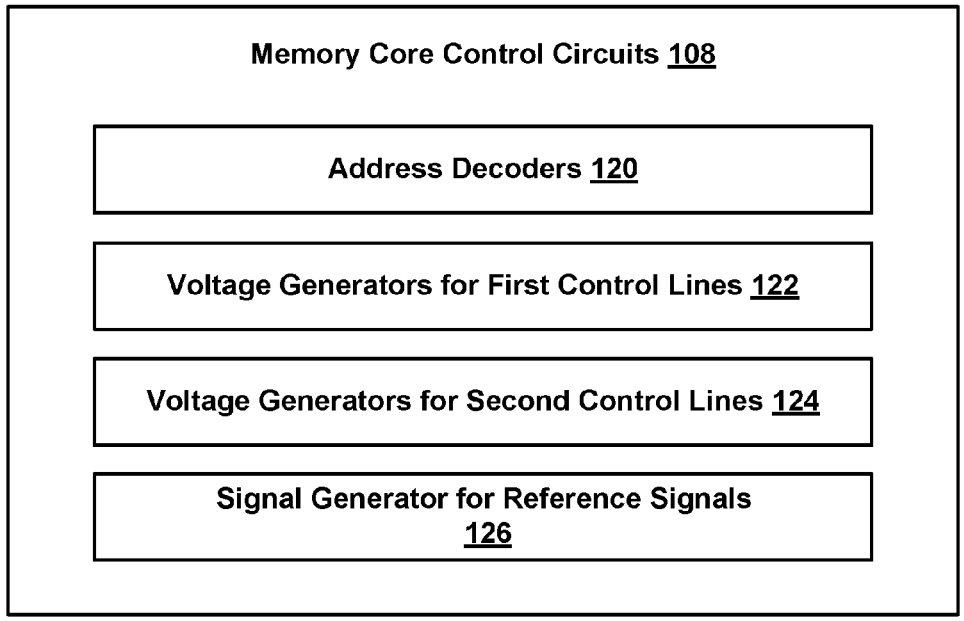
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
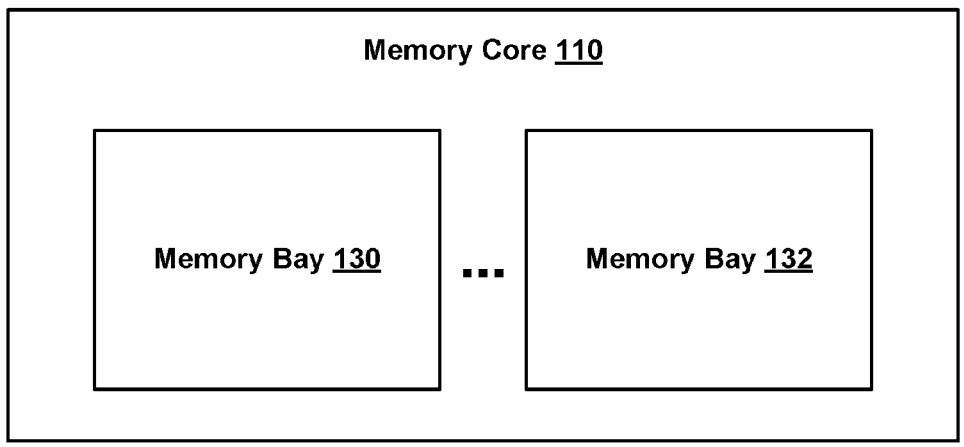
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
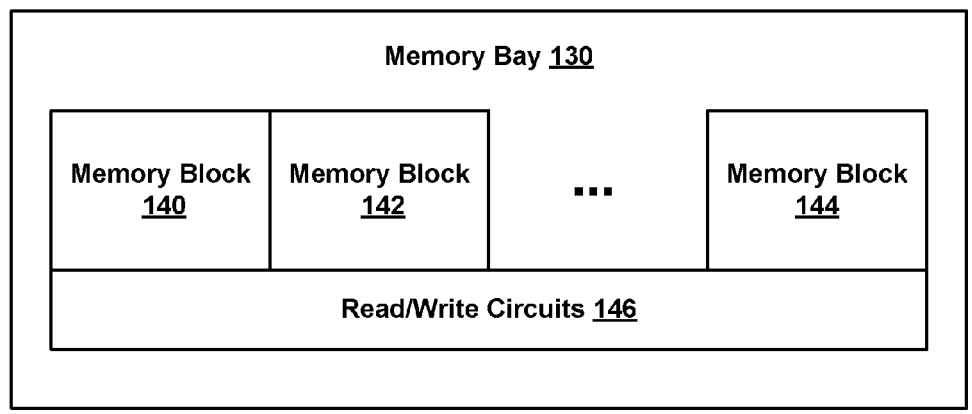
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
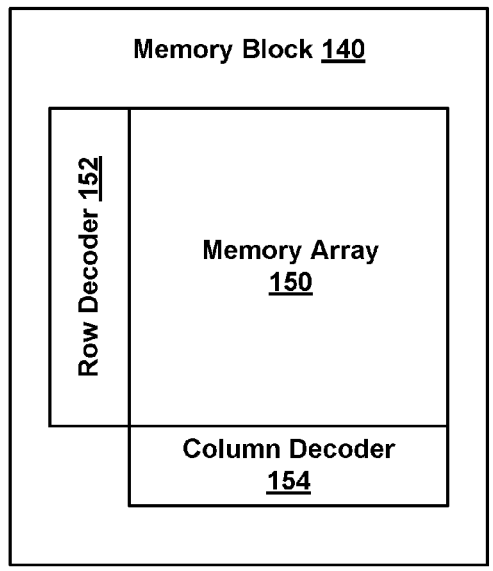
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
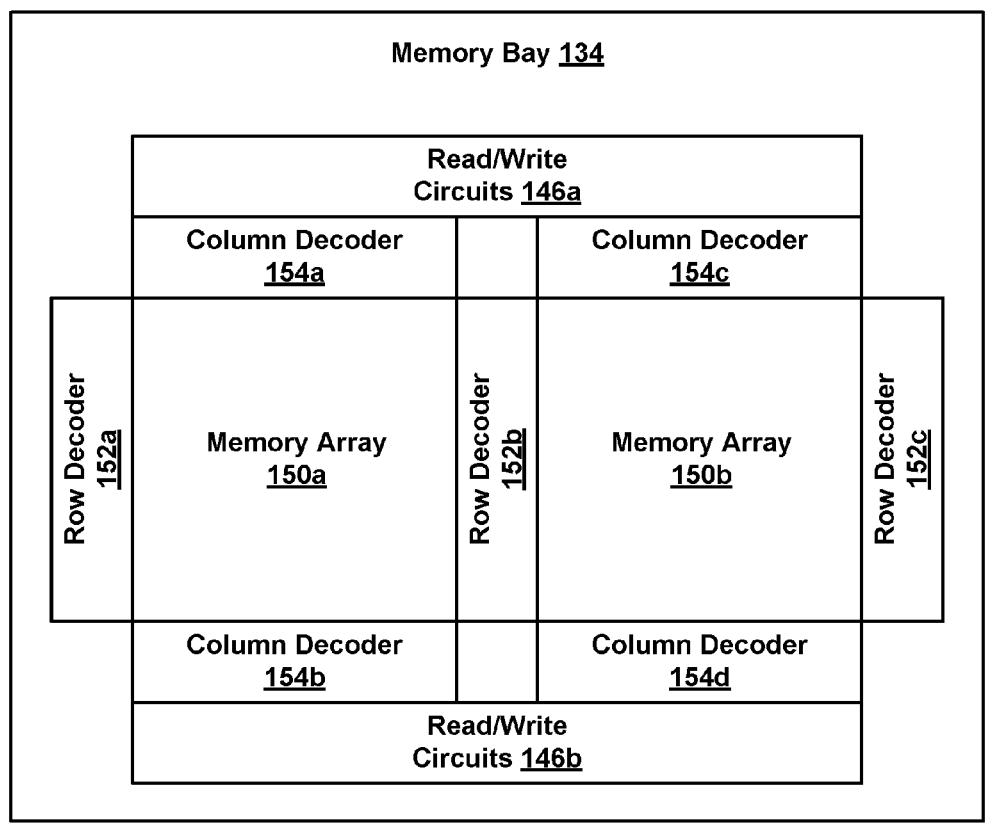
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
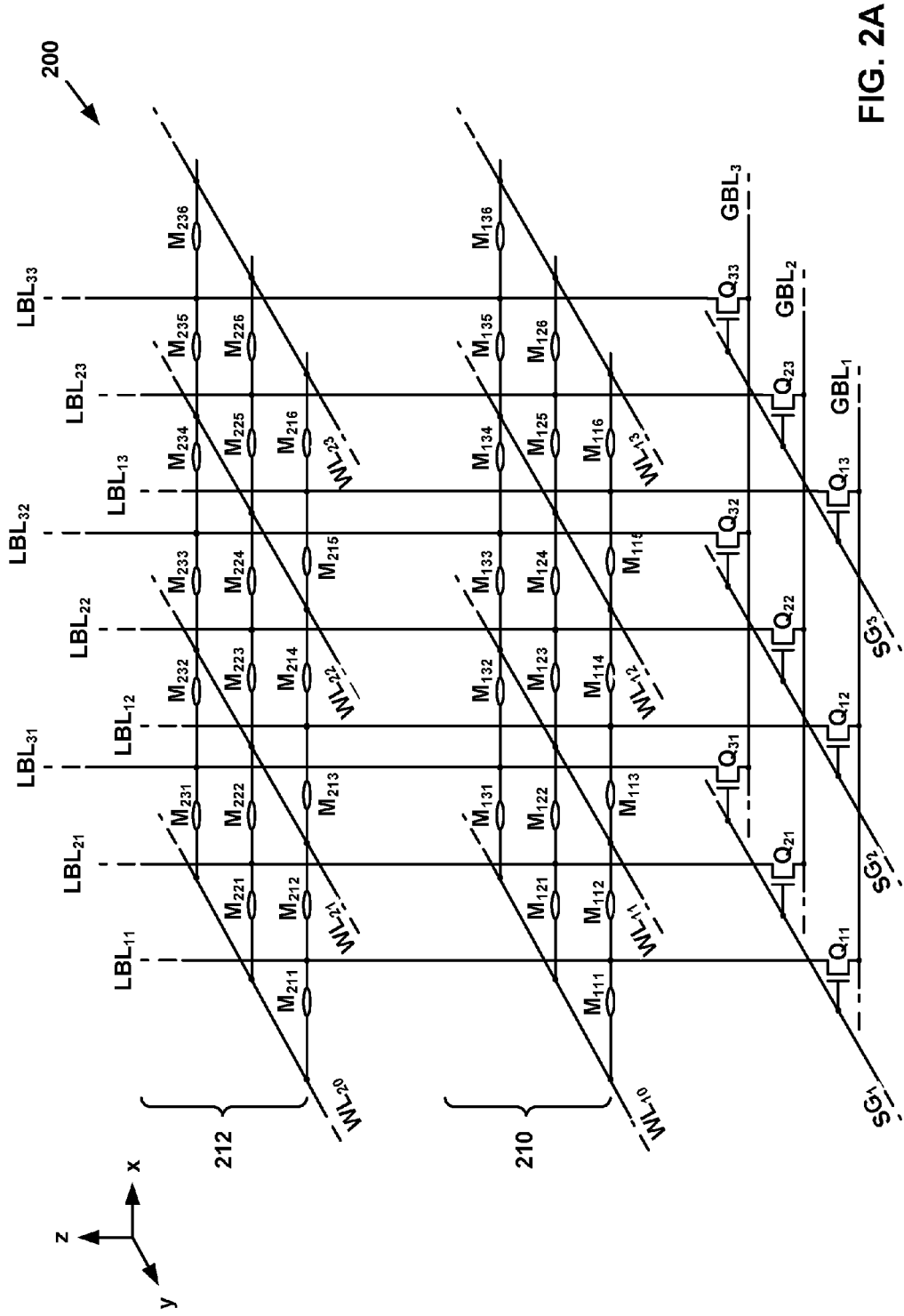
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{33}$, respectively, and may be used to connect local bit lines $LBL_{11}$-$LBL_{33}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as memory array 200, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

Figure 2B:
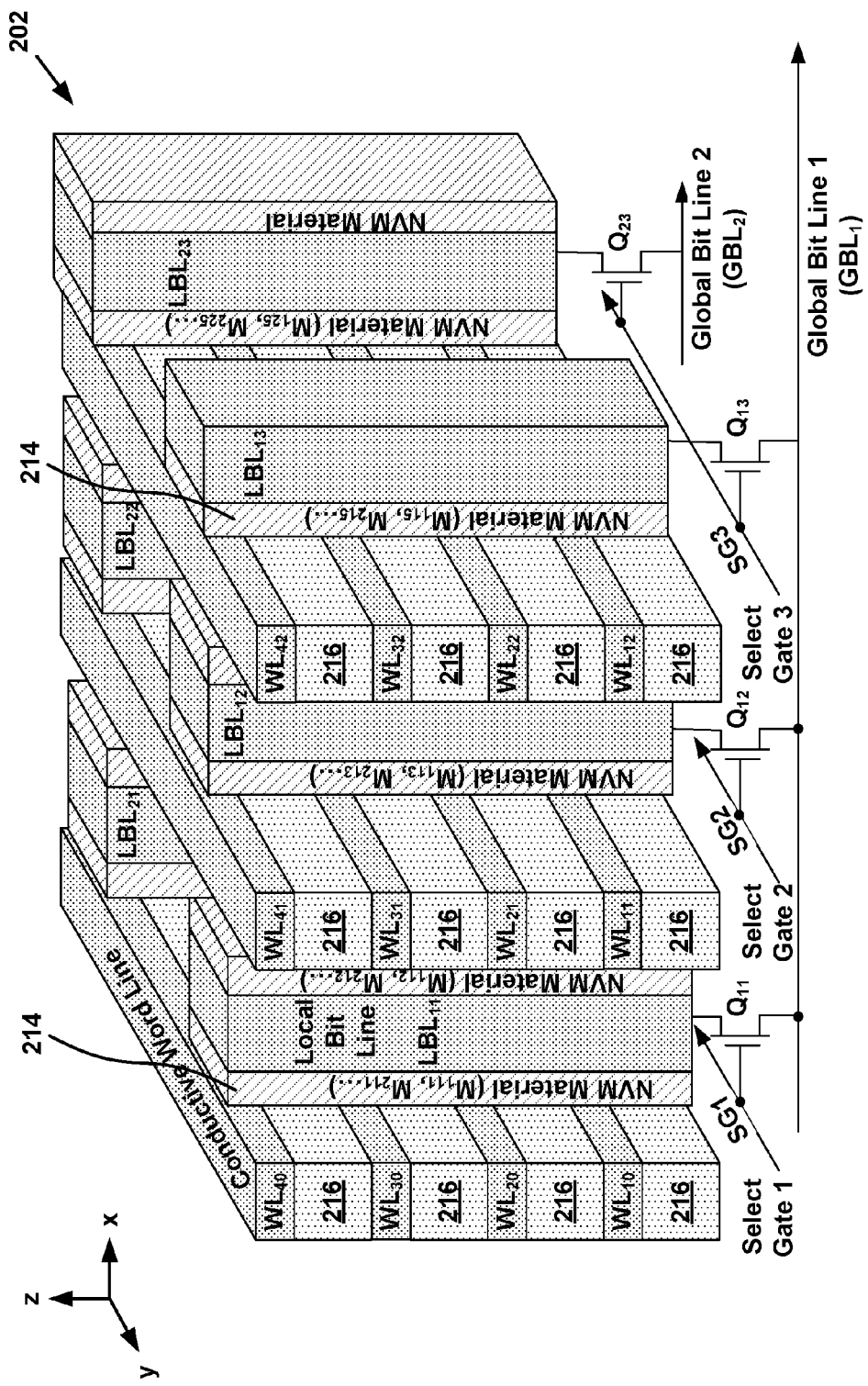
FIG. 2B depicts an embodiment of a portion of a monolithic three-dimensional memory array that includes vertical strips of a non-volatile memory material.

FIG. 2B depicts an embodiment of a portion of a monolithic three-dimensional memory array 202 that includes vertical strips of a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, . . . , $WL_{42}$ that are formed in a first direction (e.g., an x-direction), vertical bit lines $LBL_{11}$, $LBL_{12}$, $LBL_{13}$, . . . , $LBL_{23}$ that are formed in a second direction perpendicular to the first direction (e.g., a z-direction), and vertical strips of non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, . . . , $WL_{42}$.

The vertical strip of the non-volatile memory material 214 may include, for example, a vertical oxide material, a vertical reversible resistance-switching memory material (e.g., a metal oxide layer such as nickel oxide, hafnium oxide, or other similar metal oxide material, a phase change material or other similar reversible resistance-switching memory material), or a vertical charge trapping material (e.g., a layer of silicon nitride). In an embodiment, the vertical strip of material 214 may include a single continuous layer of material that may be used by a plurality of memory cells or devices.

In an embodiment, portions of the vertical strip of the non-volatile memory material 214b may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, . . . , $LBL_{23}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

Figure 3:
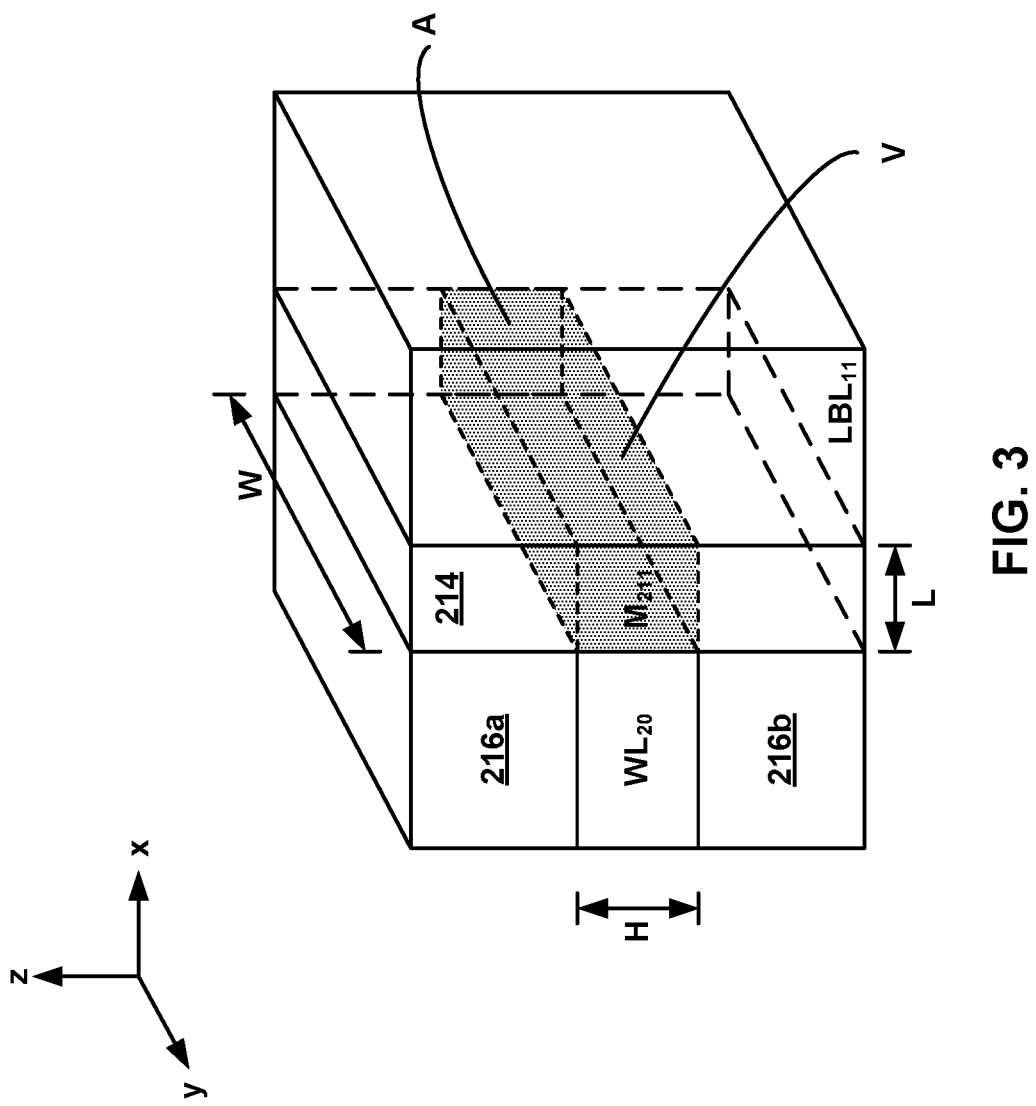
FIG. 3 depicts an enlarged view of a portion of a monolithic three-dimensional memory array of FIG. 2B.

FIG. 3 depicts an enlarged view of a portion of a monolithic three-dimensional memory array 202 of FIG. 2B, in which a vertical strip of the non-volatile memory material 214 includes a reversible resistance-switching memory material. For simplicity, vertical strip of the non-volatile memory material 214 will be referred to in the remaining discussion as reversible resistance-switching memory material 214.

In particular, FIG. 3 illustrates a portion of vertical bit line $LBL_{11}$ and reversible resistance-switching memory material 214, a portion of word line $WL_{20}$ that intersects with reversible resistance-switching memory material 214, a corresponding portion of spacer 216a disposed on a top side of word line $WL_{20}$, a corresponding portion of spacer 216b disposed on a bottom side of word line $WL_{20}$, and memory cell $M_{211}$ disposed between vertical bit line $LBL_{11}$ and word line $WL_{20}$.

Word line $WL_{20}$ has a height H, and reversible resistance-switching memory material 214 has a width W and a length L. Memory cell $M_{211}$ has a "working" cell area A=H×W, which is the area encompassed by the intersection of word line $WL_{20}$ and reversible resistance-switching memory material 214 on the y-z plane, and has a "working" cell volume V=H×W×L.

There may be benefits to reducing the size (e.g., the working cell area and working cell volume) of memory cells in a monolithic three-dimensional memory array, such as monolithic three-dimensional memory array 202 of FIG. 2B. In particular, without wanting to be bound by any particular theory, reducing the size of memory cells may reduce cell-to-cell variations, reduce memory cell operating current and power, and improve memory cell reliability.

One technique for reducing memory cell size is to reduce the height H of word lines in the memory array. Such a modification, however, would disadvantageously increase word line resistance. As a result, voltage drops along word lines, would increase, and negatively affect operation of the memory array.

Technology is described for reducing memory cell size without increasing word line resistance. In particular, technology is described for three-dimensional nonvolatile memory arrays that include word lines that include multiple conductive material layers.

Figure 4A:
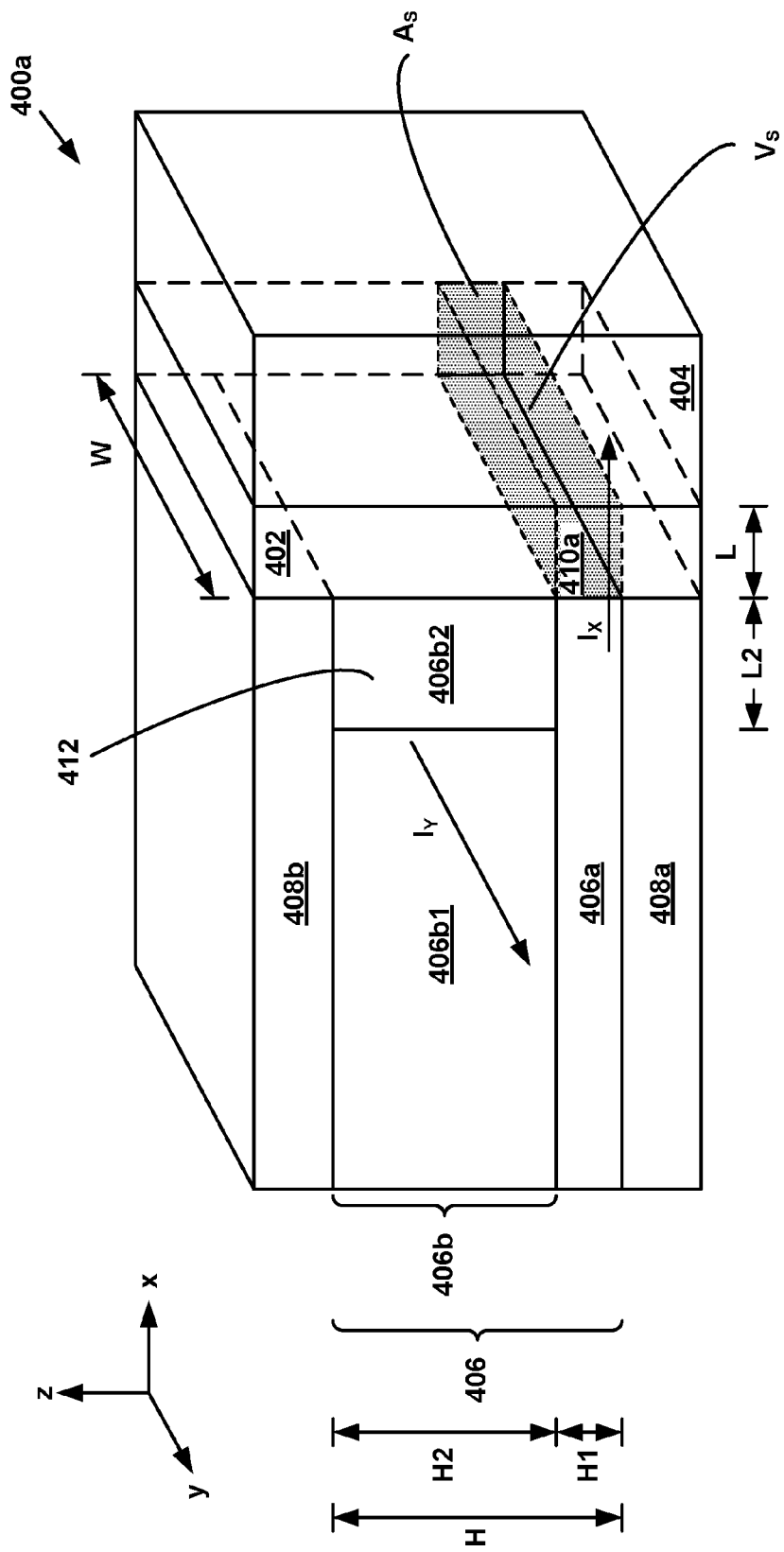
FIG. 4A-4E depict enlarged views of portions of monolithic three-dimensional memory arrays.

FIG. 4A depicts an enlarged view of a portion of a monolithic three-dimensional memory array 400a that includes a portion of a reversible resistance-switching memory material 402 and a vertical bit line 404, a portion of a multi-layer word line 406 that intersects with reversible resistance-switching memory material 402, a corresponding portion of a dielectric spacer 408a disposed below multi-layer word line 406, a corresponding portion of a dielectric spacer 408b disposed above multi-layer word line 406, and a memory cell 410a disposed between vertical bit line 404 and multi-layer word line 406.

Multi-layer word line 406 has a height H, and reversible resistance-switching memory material 402 has a width W and a length L. Multi-layer word line 406 includes a first conductive material layer 406a and a second conductive material layer 406b disposed on first conductive material layer 406a. First conductive material layer 406a has a first height H1, and second conductive material layer 406b has a second height H2, with H1+H2=H. In an embodiment, second height H2 is greater than first height H1. Height H may be between about 100 angstroms and about 250 angstroms, first height H1 may be between about 30 angstroms and about 75 angstroms, and second height H2 may be between about 70 angstroms and about 175 angstroms, although other values may be used for first height H1 and second height H2.

Second conductive material layer 406b includes a first portion 406b1 and a second portion 406b2. Second portion 406b2 is disposed at a tip 412 of second conductive material layer 406b adjacent reversible resistance-switching memory material 402, has a length L2 and is substantially non-conductive. In embodiments, length L2 may be between about 10 angstroms and about 20 angstroms, although other lengths may be used. In an embodiment, second portion 406b2 of second conductive material layer 406b is an oxide of first portion 406b1 of second conductive material layer 406b. Other materials may be used for second portion 406b2 of second conductive material layer 406b.

In an embodiment, first conductive material layer 406a is a conductive material (e.g., titanium nitride), first portion 406b1 of second conductive material layer 406b is a conductive material (e.g., tantalum or tantalum nitride), and second portion 406b2 of second conductive material layer 406b is a substantially non-conductive material (e.g., tantalum oxide or tantalum oxynitride). Other materials may be used for first conductive material layer 406a, first portion 406b1 of second conductive material layer 406b, and second portion 406b2 of second conductive material layer 406b.

In an embodiment, first conductive material layer 406a has a first sheet resistance RS1, and first portion 406b1 of second conductive material layer 406b has a second sheet resistance RS2, with RS2<<RS1. Without wanting to be bound by any particular theory, it is believed that substantially all of a current $I_Y$ conducted along a length (e.g., in the y-axis direction) of multi-layer word line 406 is conducted by first portion 406b1 of second conductive material layer 406b. Thus, second height H2 and the material used for first portion 406b1 of second conductive material layer 406b may be selected to achieve a desired resistance for multi-layer word line 406.

Because second portion 406b2 of second conductive material layer 406b is substantially non-conductive, substantially all of a current $I_X$ conducted between multi-layer word line 406, memory cell 410a and vertical bit line 404 is conducted by first conductive material layer 406a, and substantially no portion of current $I_X$ is conducted by second portion 406b2 of second conductive material layer 406b.

Memory cell 410a has a height substantially equal to first height H1 of first conductive material layer 406a. Thus, memory cell 410a has a "working" cell area $A_S$=H1×W, which is the area encompassed by the intersection of first conductive material layer 406a and reversible resistance-switching memory material 402 on the y-z plane, and has a "working" cell volume $V_S$=H1×W×L. Because substantially non-conductive second portion 406b2 of second conductive material layer 406b is disposed adjacent reversible resistance-switching memory material 402, the size of memory cell 410a is determined by the height (e.g., first height H1) of first conductive material layer 406a.

As described above, memory cell $M_{211}$ of FIG. 3 has a working cell area A=H×W, and has a working cell volume V=H×W×L. Because first height H1 of first conductive material layer 406a is less than height H, working cell area $A_S$ of memory cell 410a of FIG. 4A is smaller than working cell area A of memory cell $M_{211}$ of FIG. 3. Likewise, working cell volume $V_S$ of memory cell 410a of FIG. 4A is smaller than working cell volume V of memory cell $M_{211}$ of FIG. 3.

Thus, without wanting to be bound by any particular theory, it is believed that multi-layer word line 406 can achieve a desired low word line resistance and also achieve a desired small memory cell size. Second height H2 and the material used for first portion 406b1 of second conductive material layer 406b may be selected to achieve a desired word line resistance, and first height H1 and the material used for first conductive material layer 406a) may be selected to achieve a desired memory cell size.

Figure 4B:
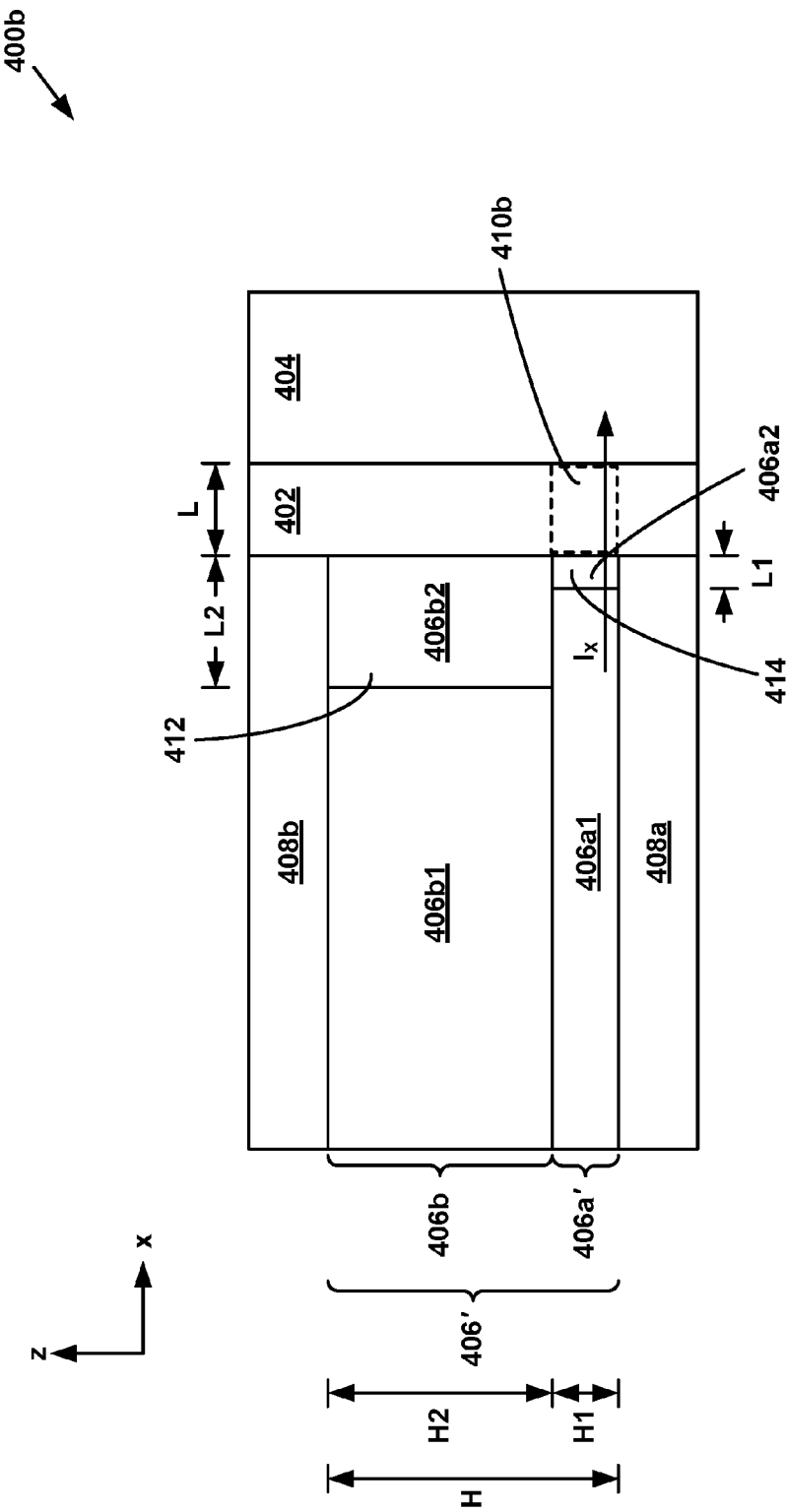

FIG. 4B depicts an enlarged side view of a portion of a monolithic three-dimensional memory array 400b that includes a portion of reversible resistance-switching memory material 402 and vertical bit line 404, a portion of multi-layer word line 406' that intersects with reversible resistance-switching memory material 402, a corresponding portion of dielectric spacer 408a disposed below multi-layer word line 406', a corresponding portion of dielectric spacer 408b disposed above multi-layer word line 406', and a memory cell 410b disposed between vertical bit line 404 and multi-layer word line 406'.

Multi-layer word line 406' includes first conductive material layer 406a' and second conductive material layer 406b disposed on first conductive material layer 406a'. Multi-layer word line 406' has a height H, and reversible resistance-switching memory material 402 has a width W and a length L. First conductive material layer 406a' has a first height H1, and second conductive material layer 406b has a second height H2, with H1+H2=H. In an embodiment, second height H2 is greater than first height H1. Memory cell 410b has a working cell area $A_S$=H1×W, and has a working cell volume $V_S$=H1×W×L.

First conductive material layer 406a' includes a first portion 406a1 and a second portion 406a2. Second portion 406a2 is disposed at a tip 414 of first conductive material layer 406a' adjacent reversible resistance-switching memory material 402 and has a length L1. In embodiments, length L1 may be between about 5 angstroms and about 20 angstroms, although other lengths may be used. Second conductive material layer 406b includes a first portion 406b1 and a second portion 406b2. Second portion 406b2 is disposed at a tip 412 of second conductive material layer 406b adjacent reversible resistance-switching memory material 402 and has a length L2. In embodiments, length L2 may be between about 10 angstroms and about 20 angstroms, although other lengths may be used.

In an embodiment, second portion 406a2 of first conductive material layer 406a' is an oxide of first portion 406a1 of first conductive material layer 406a', and second portion 406b2 of second conductive material layer 406b is an oxide of first portion 406b1 of second conductive material layer 406b. Other materials may be used for second portion 406a2 of first conductive material layer 406a' and second portion 406b2 of second conductive material layer 406b.

In an embodiment, second conductive material layer 406b is a material that oxidizes at a faster rate than first conductive material layer 406a', second portion 406a2 of first conductive material layer 406a' is an oxide of first portion 406a1 of first conductive material layer 406a', and second portion 406b2 of second conductive material layer 406b is an oxide of first portion 406b1 of second conductive material layer 406b. Because of the faster oxidation rate, second length L2 is greater than first length L1.

In an embodiment, first portion 406a1 of first conductive material layer 406a' is a conductive material (e.g., titanium nitride), second portion 406a2 of first conductive material layer 406a' is an oxide of first portion 406a1 of first conductive material layer 406a' (e.g., titanium oxynitride), first portion 406b1 of second conductive material layer 406b is a conductive material (e.g., tantalum or tantalum nitride), and second portion 406b2 of second conductive material layer 406b is a substantially non-conductive material (e.g., tantalum oxide or tantalum oxynitride). Other materials may be used for first portion 406a1 of first conductive material layer 406a', second portion 406a2 of first conductive material layer 406a', first portion 406b1 of second conductive material layer 406b, and second portion 406b2 of second conductive material layer 406b.

Without wanting to be bound by any particular theory, because length L1 is less than length L2, it is believed that substantially all of current $I_X$ conducted between multi-layer word line 406', memory cell 410b and vertical bit line 404 is conducted by first conductive material layer 406a'. In addition, without wanting to be bound by any particular theory, it is believed that second portion 406a2 of first conductive material layer 406a' conducts current $I_X$ by virtue of breakdown of second portion 406a2 of first conductive material layer 406a' and/or electron tunneling.

Figure 4C:
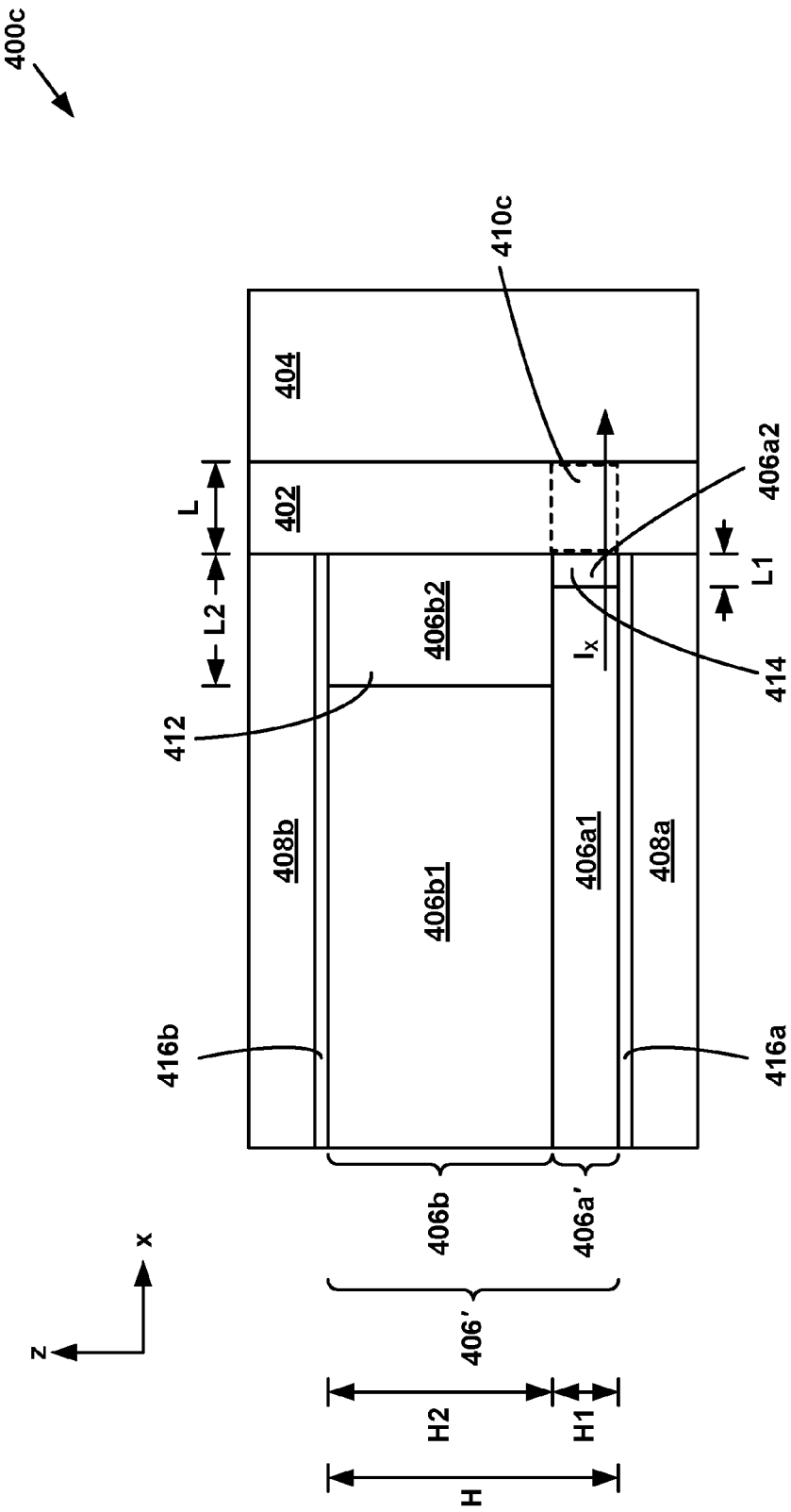

FIG. 4C depicts an enlarged side view of a portion of a monolithic three-dimensional memory array 400c that includes a portion of reversible resistance-switching memory material 402 and vertical bit line 404, a portion of multi-layer word line 406' that intersects with reversible resistance-switching memory material 402, a corresponding portion of dielectric spacer 408a disposed below multi-layer word line 406', a corresponding portion of dielectric spacer 408b disposed above multi-layer word line 406', and a memory cell 410c disposed between vertical bit line 404 and multi-layer word line 406'.

Monolithic three-dimensional memory array 400c is similar to monolithic three-dimensional memory array 400b of FIG. 4B, but also includes a liner 416a disposed between multi-layer word line 406' and dielectric spacer 408a, and a liner 416b disposed between multi-layer word line 406' and dielectric spacer 408b. Liner 416a and liner 416b may be made of the same material or different materials. In an embodiment, liner 416a and liner 416b are each between about 5 angstroms and about 20 angstroms of silicon nitride. Other line materials and thicknesses may be used.

In the examples depicted in FIGS. 4A-4C, multi-layer word lines 406 and 406' have included two conductive material layers. Persons of ordinary skill in the art will understand that multi-layer word lines may include more than two conductive material layers.

Figure 4D:
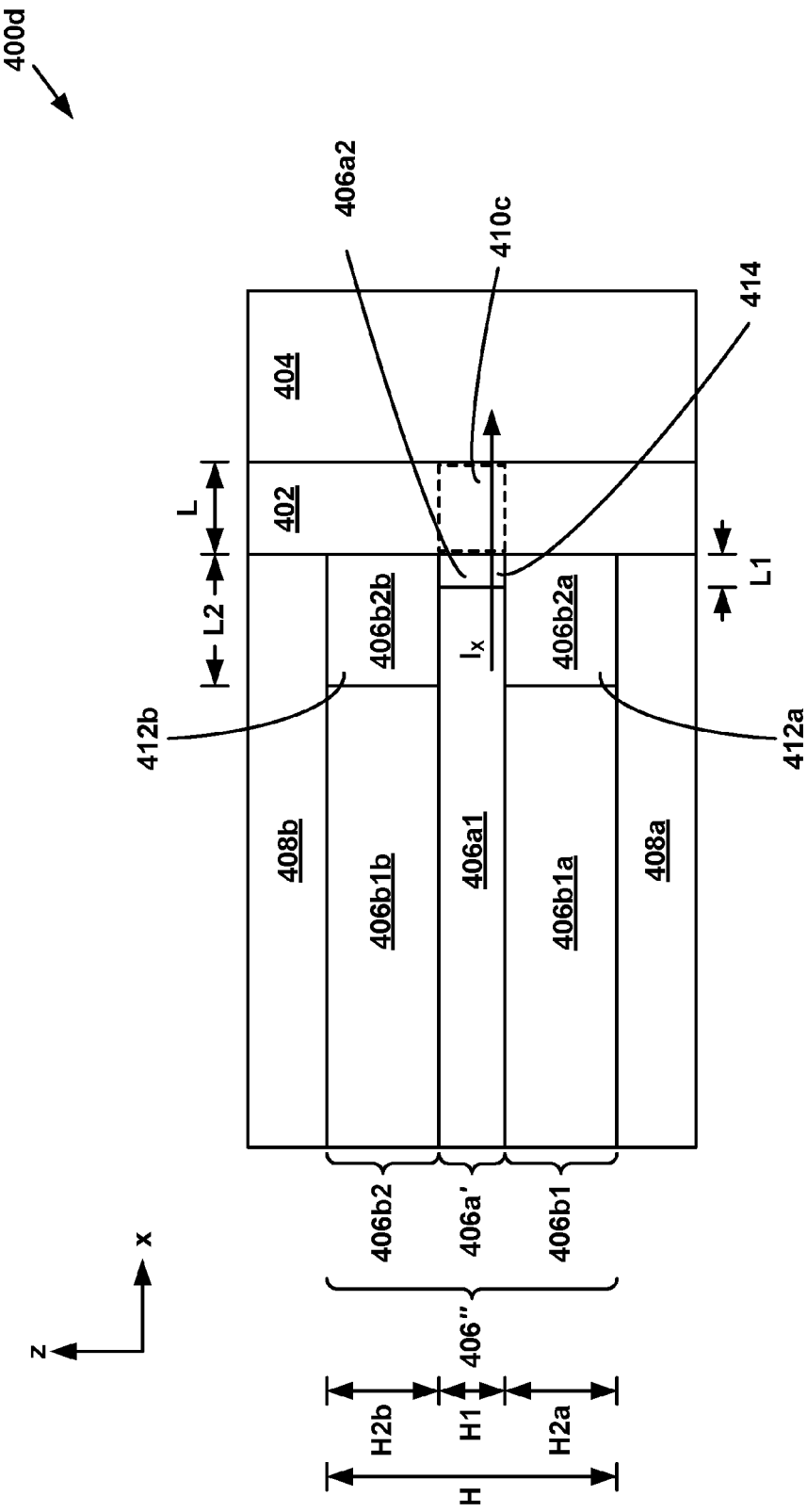

For example, FIG. 4D depicts an enlarged side view of a portion of a monolithic three-dimensional memory array 400d that includes a portion of reversible resistance-switching memory material 402 and vertical bit line 404, a portion of multi-layer word line 406" that intersects with reversible resistance-switching memory material 402, a corresponding portion of dielectric spacer 408a disposed below multi-layer word line 406", a corresponding portion of dielectric spacer 408b disposed above multi-layer word line 406", and a memory cell 410c disposed between vertical bit line 404 and multi-layer word line 406".

Multi-layer word line 406" includes first conductive material layer 406a', second conductive material layer 406b1 disposed below first conductive material layer 406a', and third conductive material layer 406b2 disposed above first conductive material layer 406a'. Multi-layer word line 406" has a height H, and reversible resistance-switching memory material 402 has a width W and a length L. First conductive material layer 406a' has a first height H1, second conductive material layer 406b1 has a second height H2a, and third conductive material layer 406b2 has a third height H2b, with H1+H2a+H2b=H. In an embodiment, second height H2a and third height H2b each are greater than first height H1. Memory cell 410d has a working cell area $A_S$=H1×W, and has a working cell volume $V_S$=H1×W×L.

First conductive material layer 406a' includes first portion 406a1 and second portion 406a2. Second portion 406a2 is disposed at tip 414 of first conductive material layer 406a' adjacent reversible resistance-switching memory material 402, and has a length L1. Second conductive material layer 406b1 includes a first portion 406b1a and a second portion 406b2a. Second portion 406b2a is disposed at a tip 412a of second conductive material layer 406b1 adjacent reversible resistance-switching memory material 402, and has a length L2. Third portion 406b2b is disposed at a tip 412b of third conductive material layer 406b2 adjacent reversible resistance-switching memory material 402, and has length L2. In an embodiment, second length L2 is greater than first length L1.

In an embodiment, second portion 406a2 of first conductive material layer 406a' is an oxide of first portion 406a1 of first conductive material layer 406a', second portion 406b2a of second conductive material layer 406b1 is an oxide of first portion 406b1a of second conductive material layer 406b1, and second portion 406b2b of third conductive material layer 406b2 is an oxide of first portion 406b1b of third conductive material layer 406b2. Other materials may be used for second portion 406a2 of first conductive material layer 406a', second portion 406b2a of second conductive material layer 406b1, and second portion 406b2b of third conductive material layer 406b2.

In an embodiment, second conductive material layer 406b1 and third conductive material layer 406b2 are fabricated of material that oxidizes at a faster rate than first conductive material layer 406a', second portion 406a2 of first conductive material layer 406a' is an oxide of first portion 406a1 of first conductive material layer 406a', second portion 406b2a of second conductive material layer 406b1 is an oxide of first portion 406b1a of second conductive material layer 406b1, and second portion 406b2b of third conductive material layer 406b2 is an oxide of first portion 406b1b of third conductive material layer 406b2. Because of the faster oxidation rate, second length L2 is greater than first length L1.

In an embodiment, first portion 406a1 of first conductive material layer 406a' is a conductive material (e.g., titanium nitride), second portion 406a2 of first conductive material layer 406a' is an oxide of first portion 406a1 of first conductive material layer 406a' (e.g., titanium oxynitride), first portion 406b1a of second conductive material layer 406b1 is a conductive material (e.g., tantalum or tantalum nitride), second portion 406b2a of second conductive material layer 406b1 is a substantially non-conductive material (e.g., tantalum oxide or tantalum oxynitride), first portion 406b1b of third conductive material layer 406b2 is a conductive material (e.g., tantalum or tantalum nitride), second portion 406b2b of third conductive material layer 406b2 is a substantially non-conductive material (e.g., tantalum oxide or tantalum oxynitride). Other materials may be used for first portion 406a1 of first conductive material layer 406a', second portion 406a2 of first conductive material layer 406a', first portion 406b1a of second conductive material layer 406b1, second portion 406b2a of second conductive material layer 406b1, first portion 406b1b of third conductive material layer 406b2, and second portion 406b2b of third conductive material layer 406b2.

Without wanting to be bound by any particular theory, because length L1 is less than length L2, it is believed that substantially all of current $I_X$ conducted between multi-layer word line 406', memory cell 410c and vertical bit line 404 is conducted by first conductive material layer 406a'. In addition, without wanting to be bound by any particular theory, it is believed that second portion 406a2 of first conductive material layer 406a' conducts current $I_X$ by virtue of breakdown of second portion 406a2 of first conductive material layer 406a' and/or electron tunneling.

Figure 4E:
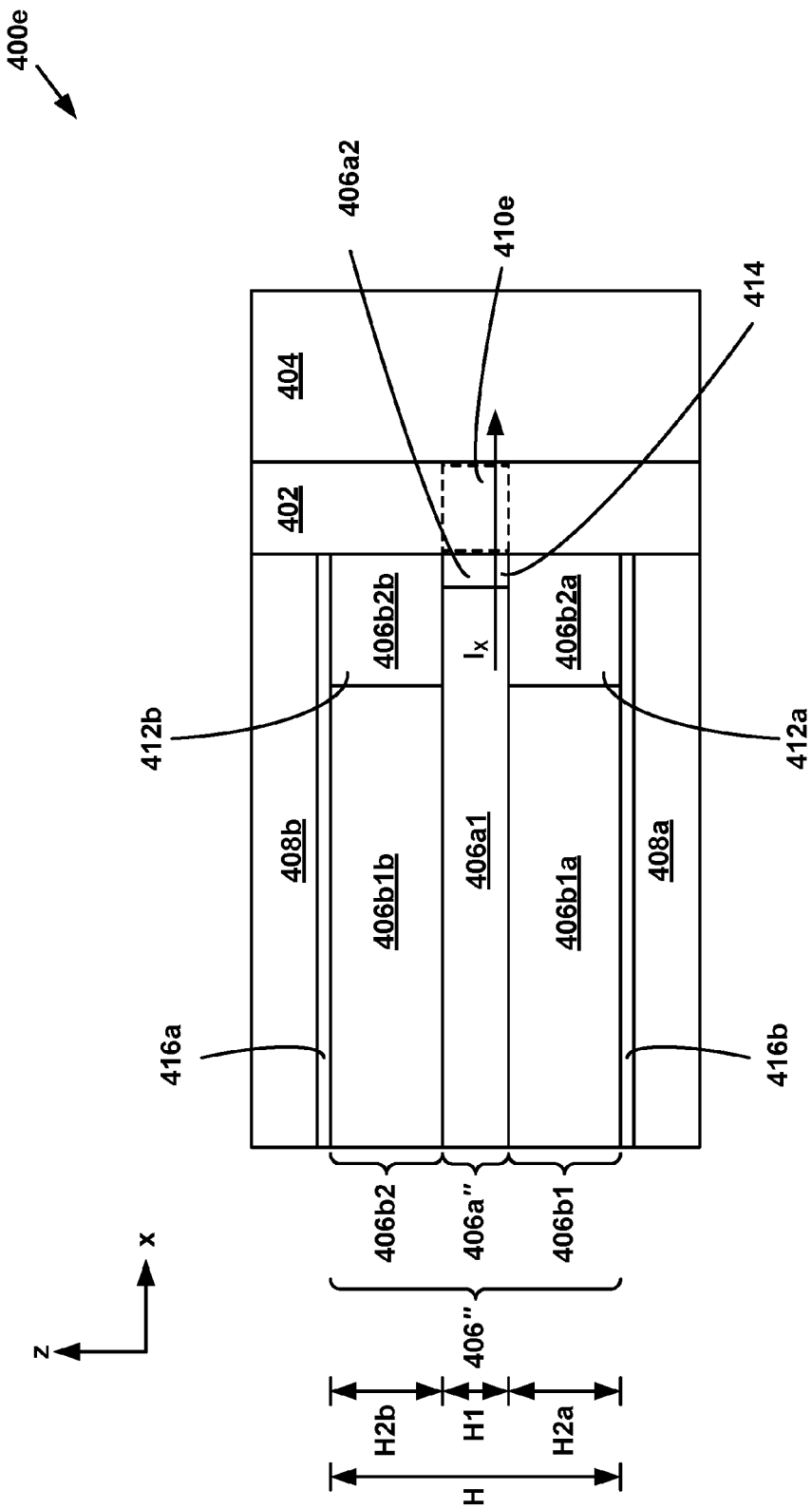

FIG. 4E depicts an enlarged side view of a portion of a monolithic three-dimensional memory array 400e that includes a portion of reversible resistance-switching memory material 402 and vertical bit line 404, a portion of multi-layer word line 406" that intersects with reversible resistance-switching memory material 402, a corresponding portion of dielectric spacer 408a disposed below multi-layer word line 406", a corresponding portion of dielectric spacer 408b disposed above multi-layer word line 406", and a memory cell 410e disposed between vertical bit line 404 and multi-layer word line 406".

Monolithic three-dimensional memory array 400e is similar to monolithic three-dimensional memory array 400d of FIG. 4D, but also includes a liner 416a disposed between multi-layer word line 406" and dielectric spacer 408a, and a liner 416b disposed between multi-layer word line 406" and dielectric spacer 408b. Liner 416a and liner 416b may be made of the same material or different materials. In an embodiment, liner 416a and liner 416b are each between about 5 angstroms and about 20 angstroms of silicon nitride. Other line materials and thicknesses may be used.

FIGS. 5A-5F depict various views of an embodiment of a portion of a monolithic three-dimensional memory array 500 that includes vertical strips of a non-volatile memory material. The physical structure depicted in FIGS. 5A-5C may include one implementation for a portion of the monolithic three-dimensional memory array depicted in FIG. 2A.

Monolithic three-dimensional memory array 500 includes vertical bit lines $LBL_{11}$-$LBL_{33}$ arranged in a first direction (e.g., a z-direction), multi-layer word lines $WL_{10}$, $WL_{11}$, ..., $WL_{43}$ arranged in a second direction (e.g., an x-direction) perpendicular to the first direction, row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions. Vertical bit lines $LBL_{11}$-$LBL_{33}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 500 may include more or fewer than twenty-four word lines, three row select lines, three global bit lines, and nine vertical bit lines.

In an embodiment, global bit lines $GBL_1$, $GBL_2$, $GBL_3$ are disposed above a substrate 502, such as a silicon, germanium, silicon-germanium, undoped, doped, bulk, silicon-on-insulator ("SOI") or other substrate with or without additional circuitry. In an embodiment, an isolation layer 504, such as a layer of silicon dioxide, silicon nitride, silicon oxynitride or any other suitable insulating layer, is formed above substrate 502.

In an embodiment, a first dielectric material layer 508 (e.g., silicon dioxide) and a second dielectric material layer 510 (e.g., silicon dioxide) are formed above isolation layer 504. Global bit lines $GBL_1$, $GBL_2$, $GBL_3$ are disposed above isolation layer 504 and are separated from one another by first dielectric material layer 508. Row select lines $SG_1$, $SG_2$, $SG_3$ are disposed above global bit lines $GBL_1$, $GBL_2$, $GBL_3$. A first etch stop layer 512 (e.g., silicon nitride) is disposed above second dielectric material layer 510. A stack of multi-layer word lines $WL_{10}$, $WL_{11}$, ..., $WL_{43}$ is disposed above first etch stop layer 512, with a third dielectric material layer 514 (e.g., silicon dioxide) separating adjacent multi-layer word lines.

In an embodiment, vertical strips of a non-volatile memory material 518 are disposed adjacent multi-layer word lines $WL_{10}$, $WL_{11}$, ..., $WL_{43}$. Vertical strips of non-volatile memory material 518 may be formed in the first direction (e.g., the z-direction). A vertical strip of non-volatile memory material 518 may include, for example, a vertical oxide layer, a vertical reversible resistance-switching material (e.g., a metal oxide layer such as nickel oxide, hafnium oxide, or other similar metal oxide material, a phase change material or other similar reversible resistance-switching material), a vertical charge trapping layer (e.g., a layer of silicon nitride), or other non-volatile memory material. A vertical strip of non-volatile memory material 518 may include a single continuous layer of material that may be used by a plurality of memory cells or devices. For simplicity, vertical strip of the non-volatile memory material 518 will be referred to in the remaining discussion as reversible resistance-switching memory material 518.

Each of multi-layer word lines $WL_{10}$, $WL_{11}$, ..., $WL_{43}$ includes a first conductive material layer and a second conductive material layer disposed above the first conductive material layer. For example, as shown in FIG. 5C, multi-layer word line $WL_{12}$ includes a first conductive material layer $WL_{12a}$ and a second conductive material layer $WL_{12b}$ disposed above first conductive material layer $WL_{12a}$, multi-layer word line $WL_{22}$ includes a first conductive material layer $WL_{22a}$ and a second conductive material layer $WL_{22b}$ disposed above first conductive material layer $WL_{22a}$, multi-layer word line $WL_{32}$ includes a first conductive material layer $WL_{32a}$ and a second conductive material layer $WL_{32b}$ disposed above first conductive material layer $WL_{32a}$, and multi-layer word line $WL_{42}$ includes a first conductive material layer $WL_{42a}$ and a second conductive material layer $WL_{42b}$ disposed above first conductive material layer $WL_{42a}$.

Each multi-layer word line first conductive material layer includes a first portion and a second portion disposed at a tip of the first conductive material layer adjacent reversible resistance-switching memory material 518. For example, as shown in FIG. 5D, first conductive material layer $WL_{20a}$ includes a first portion $WL_{20a1}$ and a second portion $WL_{20a2}$ disposed at a tip 520a of first conductive material layer $WL_{20a}$ adjacent reversible resistance-switching memory material 518a. First conductive material layer $WL_{21a}$ includes a first portion $WL_{21a1}$ and a second portion $WL_{21a2}$ disposed at a first tip 520b of first conductive material layer $WL_{21a}$ adjacent reversible resistance-switching memory material 518b, and also includes a third portion $WL_{21a3}$ disposed at a second tip 520c of first conductive material layer $WL_{21a}$ adjacent reversible resistance-switching memory material 518c. First conductive material layer $WL_{22a}$ includes a first portion $WL_{22a1}$ and a second portion $WL_{22a2}$ disposed at a first tip 520d of first conductive material layer $WL_{22a}$ adjacent reversible resistance-switching memory material 518d, and also includes a third portion $WL_{22a3}$ disposed at a second tip 520e of first conductive material layer $WL_{22a}$ adjacent reversible resistance-switching memory material 518e. First conductive material layer $WL_{23a}$ includes a first portion $WL_{23a1}$ and a second portion $WL_{23a2}$ disposed at a tip 520f of first conductive material layer $WL_{23a}$ adjacent reversible resistance-switching memory material 518f.

Each multi-layer word line second conductive material layer includes a first portion and a second portion disposed at a tip of the second conductive material layer adjacent reversible resistance-switching memory material 518. For example, as shown in FIG. 5E, second conductive material layer $WL_{20b}$ includes a first portion $WL_{20b1}$ and a second portion $WL_{20b2}$ disposed at a tip 522a of second conductive material layer $WL_{20b}$ adjacent reversible resistance-switching memory material 518a. Second conductive material layer $WL_{21b}$ includes a first portion $WL_{21b1}$ and a second portion $WL_{21b2}$ disposed at a first tip 522b of second conductive material layer $WL_{21b}$ adjacent reversible resistance-switching memory material 518b, and also includes a third portion $WL_{21b3}$ disposed at a second tip 522c of second conductive material layer $WL_{21b}$ adjacent reversible resistance-switching memory material 518c. Second conductive material layer $WL_{22b}$ includes a first portion $WL_{22b1}$ and a second portion $WL_{22b2}$ disposed at a first tip 522d of second conductive material layer $WL_{22b}$ adjacent reversible resistance-switching memory material 518d, and also includes a third portion $WL_{22b3}$ disposed at a second tip 522e of second conductive material layer $WL_{22b}$ adjacent reversible resistance-switching memory material 518e. Second conductive material layer $WL_{23b}$ includes a first portion $WL_{23b1}$ and a second portion $WL_{23b2}$ disposed at a tip 522f of second conductive material layer $WL_{23b}$ adjacent reversible resistance-switching memory material 518f.

Vertical bit lines $LBL_{11}$-$LBL_{33}$ are formed of a conductive material (e.g., a highly doped polysilicon material) and are separated from one another by a fourth dielectric material layer 524 (e.g., silicon dioxide). Vertical bit lines $LBL_{11}$-$LBL_{33}$ also may include an adhesion layer (e.g., titanium nitride) (not shown) disposed on an outer surface of each vertical bit line $LBL_{11}$-$LBL_{33}$. In some embodiments, each of a vertical bit lines $LBL_{11}$-$LBL_{33}$ includes a vertical structure (e.g., a rectangular prism, a cylinder, or a pillar), and the vertical strip of reversible resistance-switching memory material 518 may completely or partially surround the vertical structure (e.g., a conformal layer of reversible resistance-switching material surrounding the sides of the vertical structure).

A memory cell is disposed between the intersection of each vertical bit line and the first conductive material layer of each multi-layer word line. For example, a memory cell $M_{111}$ is disposed between vertical bit line $LBL_{11}$ and first conductive material layer $WL_{10a}$ of multi-layer word line $WL_{10}$, a memory cell $M_{116}$ is disposed between vertical bit line $LBL_{13}$ and first conductive material layer $WL_{13a}$ of multi-layer word line $WL_{13}$, a memory cell $M_{411}$ is disposed between vertical bit line $LBL_{11}$ and first conductive material layer $WL_{40a}$ of multi-layer word line $WL_{40}$, and so on. In an embodiment, monolithic three-dimensional memory array 500 includes seventy-two memory cells $M_{111}$, $M_{112}$, . . . , $M_{436}$. Persons of ordinary skill in the art will understand that monolithic three-dimensional memory arrays may include more or fewer than seventy-two memory cells.

In an example, portions of the vertical strip of reversible resistance-switching material 518 may include a part of memory cell $M_{111}$ associated with the cross section between first conductive material layer $WL_{10a}$ of multi-layer word line $WL_{10}$ and $LBL_{11}$, and a part of memory cell $M_{211}$ associated with the cross section between first conductive material layer $WL_{20a}$ of multi-layer word line $WL_{20}$ and $LBL_{11}$.

Each of memory cells $M_{111}$, $M_{112}$, . . . , $M_{436}$ may include a floating gate device, a charge trap device (e.g., using a silicon nitride material), a resistive change memory device, or other type of memory device. Vertically-oriented bit line select transistors $Q_{11}$-$Q_{33}$ may be used to select a corresponding one of vertical bit lines $LBL_{11}$-$LBL_{33}$. Vertically-oriented bit line select transistors $Q_{11}$-$Q_{33}$ may be field effect transistors, although other transistors types may be used.

Each of vertically-oriented bit line select transistors $Q_{11}$-$Q_{33}$ has a first terminal (e.g., a drain/source terminal), a second terminal (e.g., a source/drain terminal), a first control terminal (e.g., a first gate terminal) and a second control terminal (e.g., a second gate terminal). The first gate terminal and the second gate terminal may be disposed on opposite sides of the vertically-oriented bit line select transistor. The first gate terminal may be used to selectively induce a first conductive channel between the first terminal and the second terminal of the transistor, and the second gate terminal may be used to selectively induce a second conductive channel between the first terminal and the second terminal of the transistor.

In an embodiment, the first gate terminal and the second gate terminal are coupled together to form a single control terminal that may be used to collectively turn ON and OFF the vertically-oriented bit line select transistor. Thus, the first gate terminal and the second gate terminal of each of vertically-oriented bit line select transistors $Q_{11}$-$Q_{33}$ may be used to select a corresponding one of vertical bit lines $LBL_{11}$, $LBL_{12}$, . . . , $LBL_{33}$. Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Figure 5A:
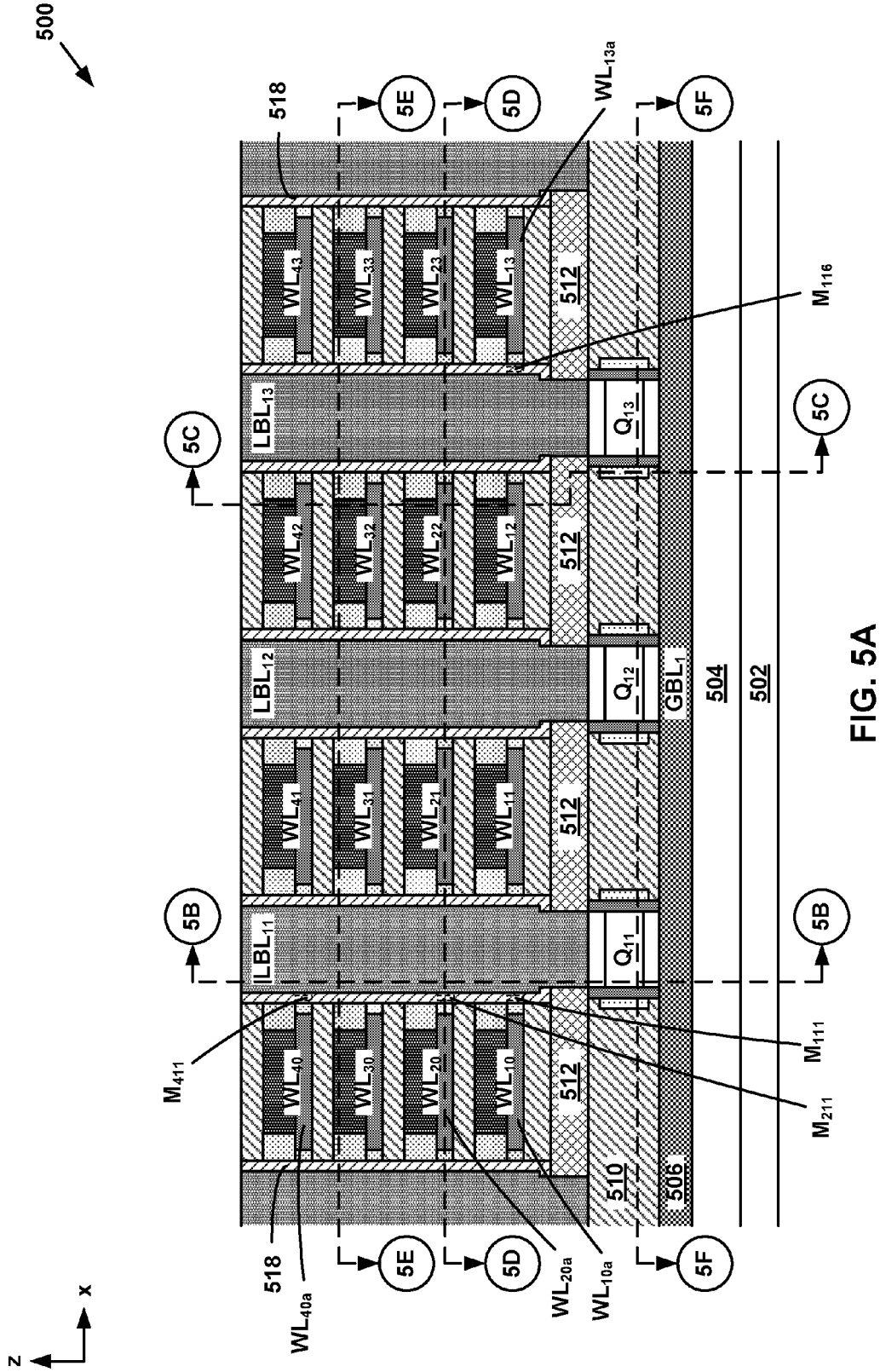
FIGS. 5A-5F depict various views of an embodiment monolithic three-dimensional memory array.
Figure 5B:
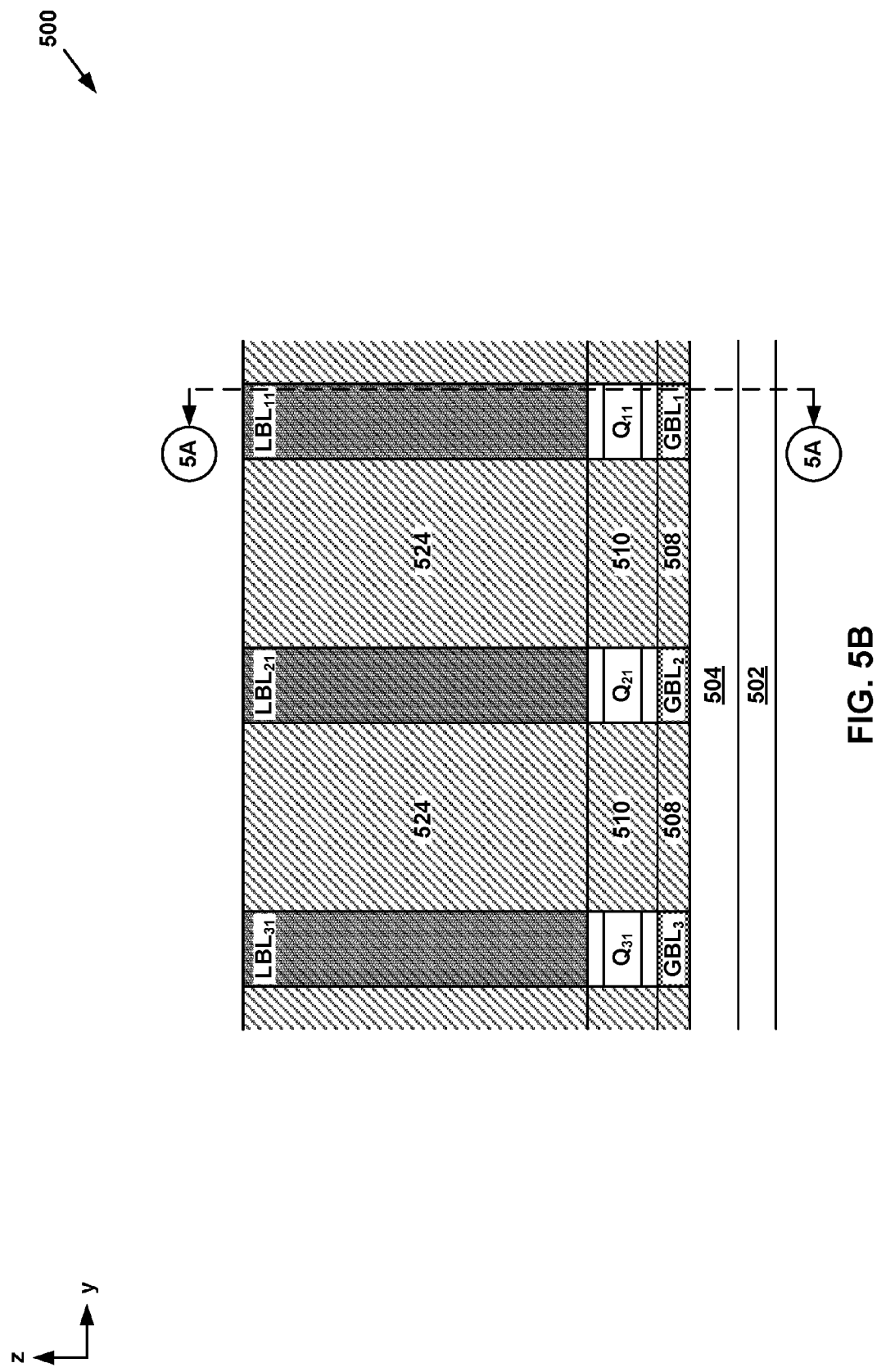
Figure 5C:
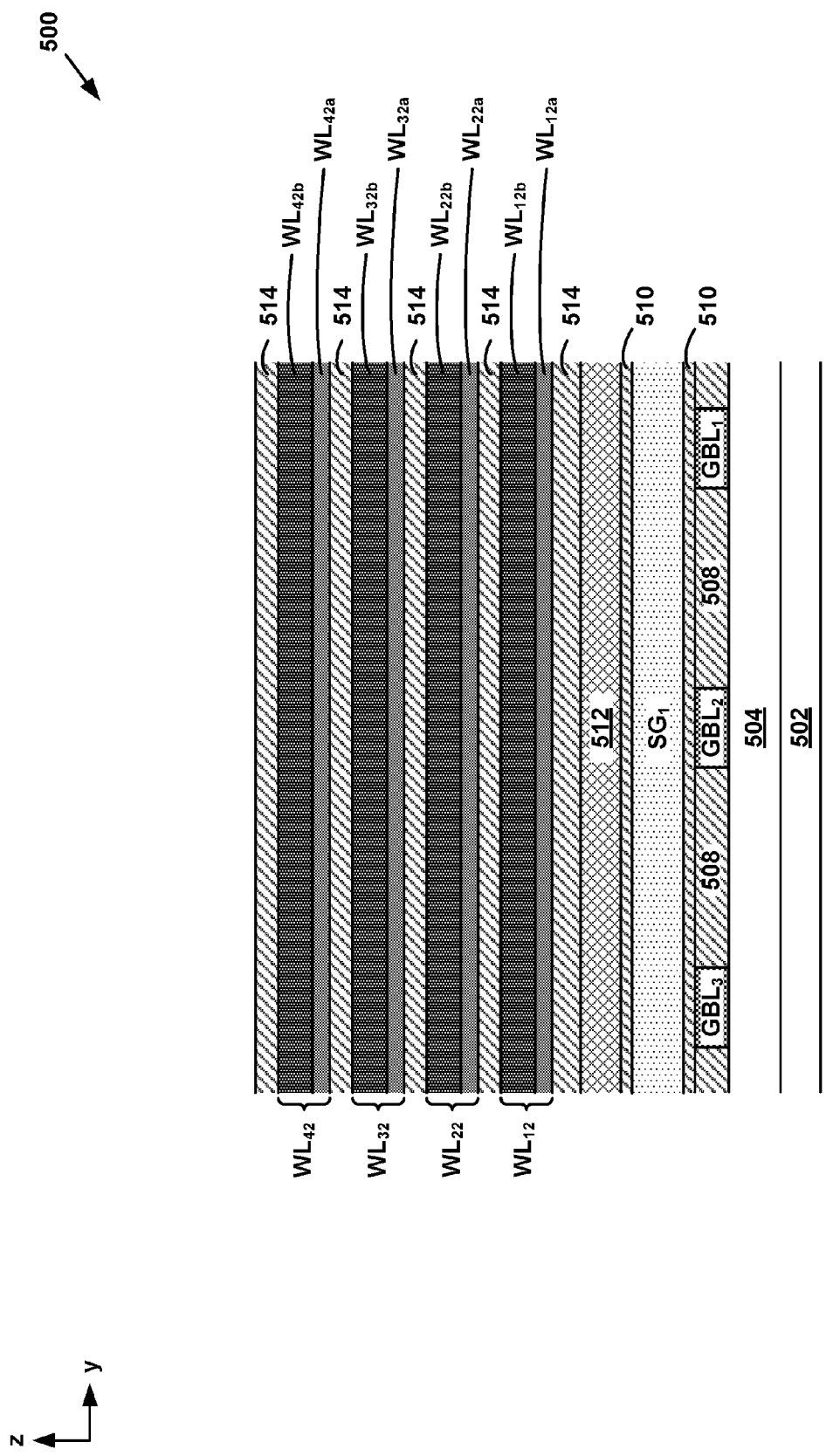
Figure 5D:
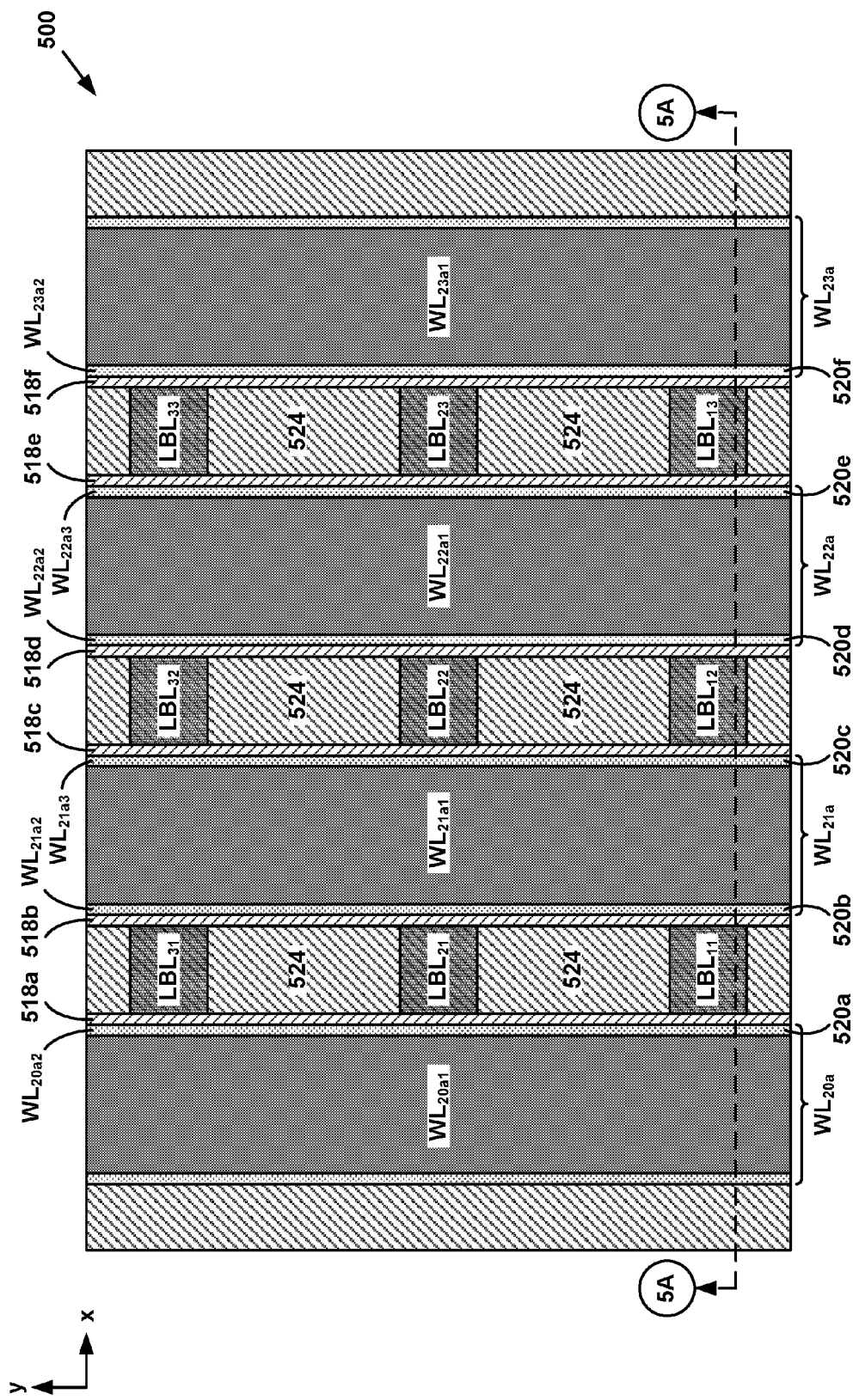
Figure 5E:
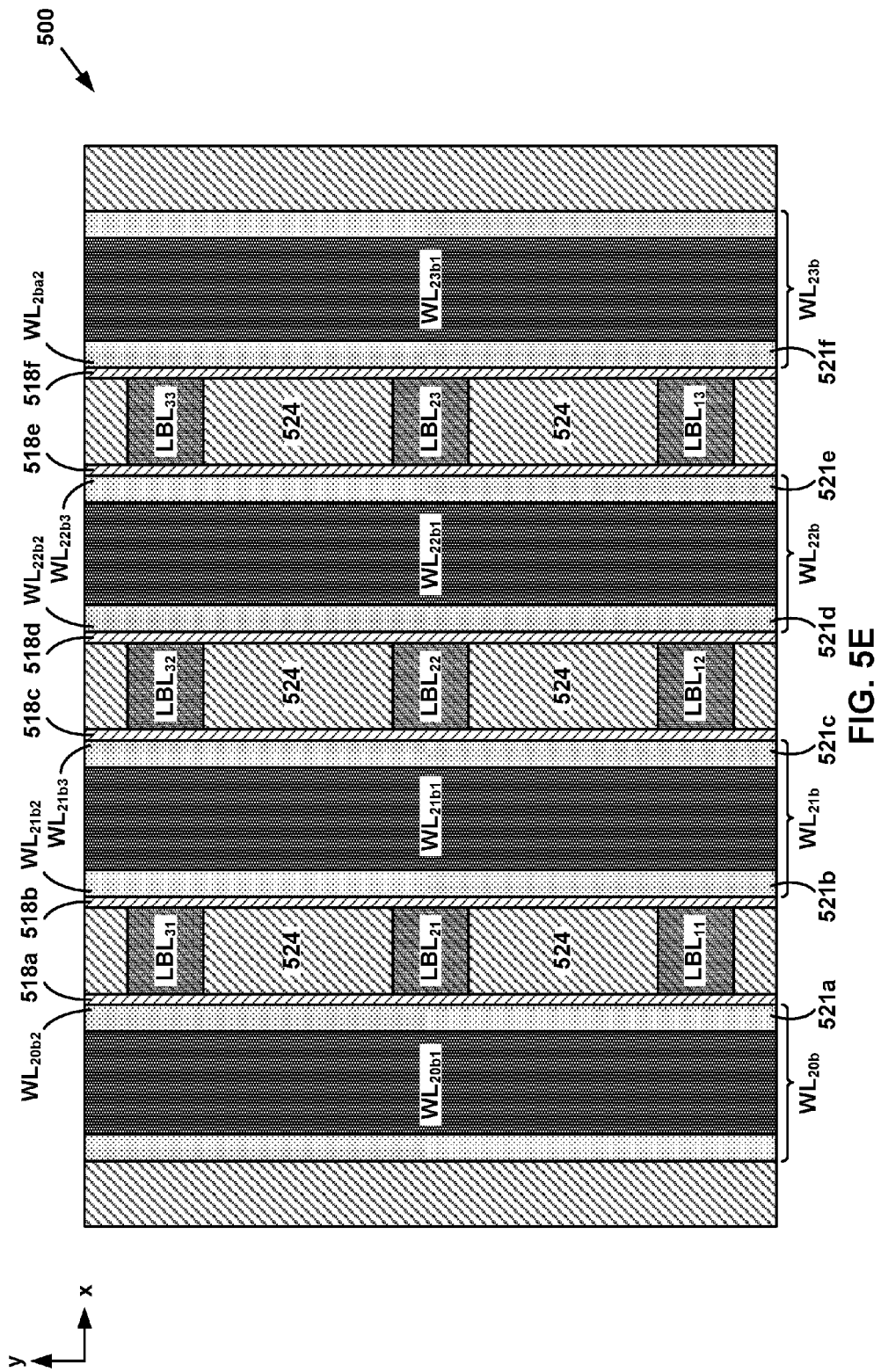
Figure 5F:
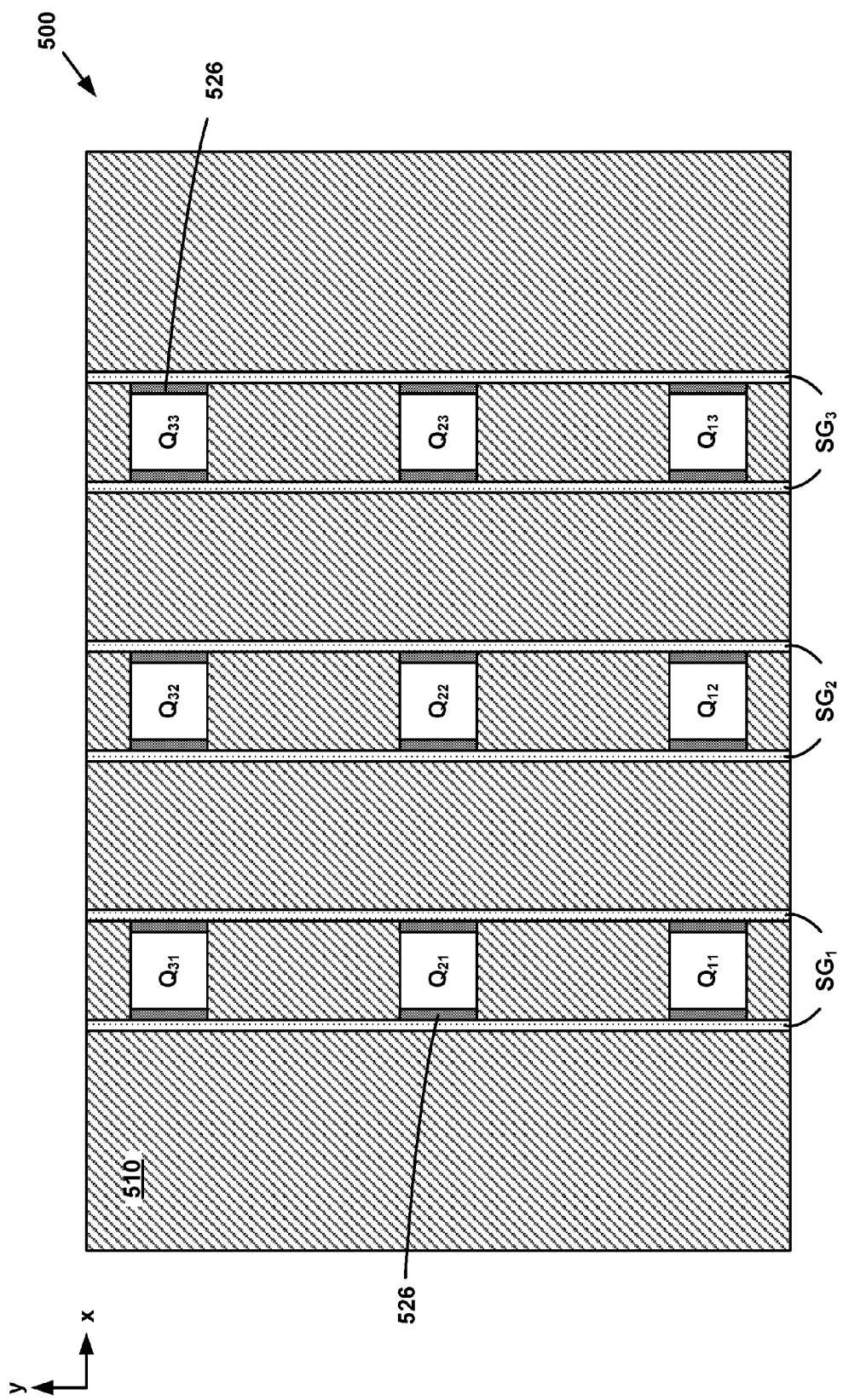

Referring to FIGS. 5A and 5F, vertically-oriented bit line select transistors $Q_{11}$, $Q_{12}$, $Q_{13}$ are used to selectively connect/disconnect vertical bit lines $LBL_{11}$, $LBL_{12}$, $LBL_{13}$ to/from global bit line $GBL_1$ using row select lines $SG_1$, $SG_2$, $SG_3$, respectively. In particular, each of vertically-oriented bit line select transistors $Q_{11}$, $Q_{12}$, $Q_{13}$ has a first terminal (e.g., a drain./source terminal) coupled to a corresponding one of vertical bit lines $LBL_{11}$, $LBL_{12}$, $LBL_{13}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1$, $SG_2$, $SG_3$ are used to turn ON/OFF vertically-oriented bit line select transistors $Q_{11}$, $Q_{12}$, $Q_{13}$, respectively, to connect/disconnect vertical bit lines $LBL_{11}$, $LBL_{12}$, $LBL_{13}$, respectively, to/from global bit line $GBL_1$. A gate dielectric material layer 526 (e.g., silicon dioxide) is disposed between row select lines $SG_1$, $SG_2$, $SG_3$ and vertically-oriented bit line select transistors $Q_{11}$, $Q_{12}$, $Q_{13}$.

Likewise, vertically-oriented bit line select transistors $Q_{11}$, $Q_{21}$, . . . , $Q_{33}$ are used to selectively connect/disconnect vertical bit lines $LBL_{11}$, $LBL_{21}$, $LBL_{31}$ to global bit lines $GBL_1$, $GBL_2$, $GBL_3$, respectively, using row select line $SG_1$. In particular, each of vertically-oriented bit line select transistors $Q_{11}$, $Q_{21}$, $Q_{31}$ has a first terminal (e.g., a drain./source terminal) coupled to a corresponding one of vertical bit lines $LBL_{11}$, $LBL_{21}$, $LBL_{31}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}$, $Q_{21}$, $Q_{31}$ to connect/disconnect vertical bit lines $LBL_{11}$, $LBL_{21}$, $LBL_{31}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit lines $LBL_{13}$, $LBL_{23}$, $LBL_{33}$ to/from global bit lines $GBL_1$, $GBL_2$, $GBL_3$, respectively, using row select line $SG_3$. In particular, each of vertically-oriented bit line select transistors $Q_{13}$, $Q_{23}$, $Q_{33}$ has a first terminal (e.g., a drain./source terminal) coupled to a corresponding one of vertical bit lines $LBL_{13}$, $LBL_{23}$, $LBL_{33}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}$, $Q_{23}$, $Q_{33}$ to connect/disconnect vertical bit lines $LBL_{13}$, $LBL_{23}$, $LBL_{33}$, respectively, to/from global bit lines $GBL_1$, $GBL_2$, $GBL_3$, respectively.

Referring now to FIGS. 6A1-6H3, an example method of forming a monolithic three-dimensional memory array, such as monolithic three-dimensional array 500 of FIGS. 5A-5F, is described.

With reference to FIGS. 6A1-6A2, substrate 502 is shown as having already undergone several processing steps. Substrate 502 may be any suitable substrate such as a silicon, germanium, silicon-germanium, undoped, doped, bulk, silicon-on-insulator ("SOI") or other substrate with or without additional circuitry. For example, substrate 502 may include one or more n-well or p-well regions (not shown). Isolation layer 504 is formed above substrate 502. In some embodiments, isolation layer 504 may be a layer of silicon dioxide, silicon nitride, silicon oxynitride or any other suitable insulating layer.

Following formation of isolation layer 504, a conductive material layer 506 is deposited over isolation layer 504. Conductive material layer 506 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 506 may comprise between about 200 and about 2500 angstroms of tungsten. Other conductive material layers and/or thicknesses may be used. In some embodiments, an adhesion layer (not shown), such as titanium nitride or other similar adhesion layer material, may be disposed between isolation layer 504 and conductive material layer 506, and/or between conductive material layer 506 and subsequent vertically-oriented bit line select transistors layers.

Persons of ordinary skill in the art will understand that adhesion layers may be formed by PVD or another method on conductive material layers. For example, adhesion layers may be between about 20 and about 500 angstroms, and in some embodiments about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 506, conductive material layer 506 is patterned and etched. For example, conductive material layer 506 may be patterned and etched using conventional lithography techniques, with a soft or hard mask, and wet or dry etch processing. In at least one embodiment, conductive material layer 506 is patterned and etched to form global bit lines $GBL_1$, $GBL_2$, $GBL_3$. Example widths for global bit lines $GBL_1$, $GBL_2$, $GBL_3$ and/or spacings between global bit lines $GBL_1$, $GBL_2$, $GBL_3$ range between about 480 angstroms and about 1000 angstroms, although other conductor widths and/or spacings may be used.

After global bit lines $GBL_1$, $GBL_2$, $GBL_3$ have been formed, a first dielectric material layer 508 is formed over substrate 502 to fill the voids between global bit lines $GBL_1$, $GBL_2$, $GBL_3$. For example, approximately 3000-7000 angstroms of silicon dioxide may be deposited on the substrate 502 and planarized using chemical mechanical polishing or an etchback process to form a planar surface 600. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, $GBL_3$ may be formed using a damascene process in which first dielectric material layer 508 is formed, patterned and etched to create openings or voids for global bit lines $GBL_1$, $GBL_2$, $GBL_3$. The openings or voids then may be filled with conductive layer 506 (and/or a conductive seed, conductive fill and/or barrier layer if needed). Conductive material layer 506 then may be planarized to form planar surface 600.

Following planarization, the semiconductor material used to form vertically-oriented bit line select transistors $Q_{11}$-$Q_{33}$ is formed over planarized top surface 600 of substrate 502. In some embodiments, each vertically-oriented bit line select transistor is formed from a polycrystalline semiconductor material such as polysilicon, an epitaxial growth silicon, a polycrystalline silicon-germanium alloy, polygermanium or any other suitable material. Alternatively, vertically-oriented bit line select transistors $Q_{11}$-$Q_{33}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented bit line select transistor $Q_{11}$-$Q_{33}$ may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ polysilicon layer 602 may be deposited on planarized top surface 600. In some embodiments, n+ polysilicon layer 602 is in an amorphous state as deposited. In other embodiments, n+ polysilicon layer 602 is in a polycrystalline state as deposited. CVD or another suitable process may be employed to deposit n+ polysilicon layer 602.

In an embodiment, n+ polysilicon layer 602 may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ polysilicon layer 602 may be doped in situ, for example, by flowing a donor gas during deposition. Other doping methods may be used (e.g., implantation).

After deposition of n+ silicon layer 602, a doped p-type silicon layer 604 may be formed over n+ polysilicon layer 602. P-type silicon may be either deposited and doped by ion implantation or may be doped in situ during deposition to form a p-type silicon layer 604. For example, an intrinsic silicon layer may be deposited on n+ polysilicon layer 602, and a blanket p-type implant may be employed to implant boron a predetermined depth within the intrinsic silicon layer. Example implantable molecular ions include $BF_2$, $BF_3$, B and the like. In some embodiments, an implant dose of about $1\text{-}10\times10^{13}$ ions/cm$^2$ may be employed. Other implant species and/or doses may be used. Further, in some embodiments, a diffusion process may be employed. In an embodiment, the resultant p-type silicon layer 604 has a thickness of from about 800 to about 4000 angstroms, although other p-type silicon layer sizes may be used.

Following formation of p-type silicon layer 604, a heavily doped n+ polysilicon layer 606 is deposited on p-type silicon layer 604. In some embodiments, n+ polysilicon layer 606 is in an amorphous state as deposited. In other embodiments, n+ polysilicon layer 606 is in a polycrystalline state as deposited. CVD or another suitable process may be employed to deposit n+ polysilicon layer 606.

In an embodiment, n+ polysilicon layer 606 may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ polysilicon layer 606 may be doped in situ, for example, by flowing a donor gas during deposition. Other doping methods may be used (e.g., implantation). Persons of ordinary skill in the art will understand that silicon layers 602, 604 and 606 alternatively may be doped p+/n/p+, respectively, or may be doped with a single type of dopant to produce junctionless-FETs.

Following formation of n+ polysilicon layer 606, silicon layers 602, 604 and 606 are patterned and etched to form vertical transistor pillars. For example, silicon layers 602, 604 and 606 may be patterned and etched using conventional lithography techniques, with wet or dry etch processing. In an embodiment, silicon layers 602, 604 and 606 are patterned and etched to form vertical transistor pillars disposed above global bit lines $GBL_1$, $GBL_2$, $GBL_3$. The vertical transistor pillars will be used to form vertically-oriented bit line select transistors $Q_{11}$-$Q_{33}$.

Silicon layers 602, 604 and 606 may be patterned and etched in a single pattern/etch procedure or using separate pattern/etch steps. Any suitable masking and etching process may be used to form vertical transistor pillars. For example, silicon layers may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, the vertical transistor pillars may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A gate dielectric material layer 526 is deposited conformally over substrate 502, and forms on sidewalls of the vertical transistor pillars. For example, between about 30 angstroms to about 100 angstroms of silicon dioxide may be deposited. Other dielectric materials such as silicon nitride, silicon oxynitride, low K dielectrics, etc., and/or other dielectric material layer thicknesses may be used.

Gate electrode material is deposited over the vertical transistor pillars and gate dielectric material layer 526 to fill the voids between the vertical transistor pillar. For example, approximately 10 nm to about 20 nm of titanium nitride or other similar metal, a highly-doped semiconductor, such as n+ polysilicon, p+ polysilicon, or other similar conductive material may be deposited. The as-deposited gate electrode material is subsequently etched back to form row select lines $SG_1$, $SG_2$, $SG_3$.

A second dielectric material layer 510 is deposited over substrate 502. For example, approximately 5000 to about 8000 angstroms of silicon dioxide may be deposited and planarized using chemical mechanical polishing or an etch-back process to form planar top surface 608, resulting in the structure shown in FIGS. 6A1-6A2. Other dielectric materials and/or thicknesses may be used.

Planar surface 608 includes exposed top surfaces of vertically-oriented bit line select transistors $Q_{11}$-$Q_{33}$ and gate dielectric material layer 526 separated by second dielectric material layer 510. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Next, a first etch stop layer 512 is formed over substrate 502. First etch stop layer 512 may include any suitable etch stop layer formed by any suitable method (e.g., CVD, PVD, etc.). In an embodiment, first etch stop layer 512 may comprise between about 50 angstroms and about 500 angstroms of silicon nitride. Other etch stop layer materials and/or thicknesses may be used.

Alternating layers of third dielectric material layer 514, a first conductive material layer 610a and a second conductive material layer 610b are formed over substrate 502. In an embodiment, each third dielectric material layer 514 may be between about 200 angstroms and about 500 angstroms of $SiO_2$, each first conductive material layer 610a may be between about 50 angstroms and about 100 angstroms of titanium nitride, and each second conductive material layer 610b may be between about 200 angstroms and about 300 angstroms of tantalum nitride. Other dielectric materials and/or thicknesses and other conductive materials and/or thicknesses may be used.

First conductive material layer 610a has a first oxidation rate Raox and second conductive material layer 610b has a second oxidation rate Rbox, with second oxidation rate Rbox greater than first oxidation rate Raox. That is Rbox/Raox=α, with α>1. In embodiments, α is between about 2 and about 15, although lower or higher values of α may be used.

In an embodiment, four sets of first conductive material layers 610a and second conductive material layers 610b are formed over substrate 502. More or fewer than four sets of first conductive material layers 610a and second conductive material layers 610b may be used.

Next, a second etch stop layer 516 is formed over substrate 502, resulting in the structure shown in FIGS. 6B1-6B2. Second etch stop layer 516 may include any suitable etch stop layer formed by any suitable method (e.g., CVD, PVD, etc.). In an embodiment, second etch stop layer 516 may comprise between about 50 angstroms and about 500 angstroms of silicon nitride. Other etch stop layer materials and/or thicknesses may be used.

Figure 6C:
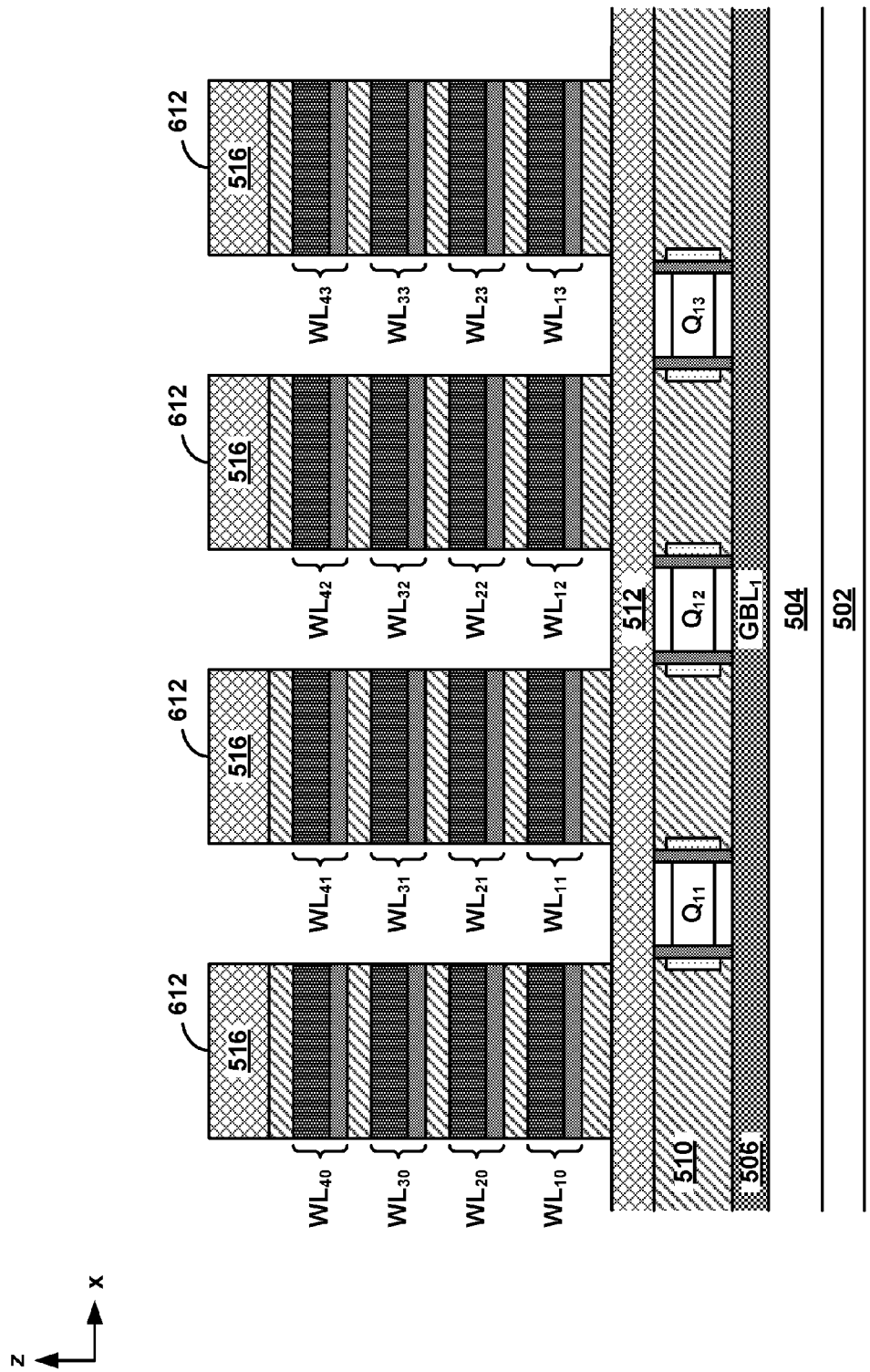

Next, second etch stop layer 516, third dielectric material layers 514, first conductive material layers 610a and second conductive material layers 610b are patterned and etched to form rows 612 of multi-layer word lines $WL_{10}$, $WL_{11}$, . . . , $WL_{43}$, resulting in the structure shown in FIG. 6C. Each of rows 612 of word lines $WL_{10}$, $WL_{11}$, . . . , $WL_{43}$ may be between about 200 angstroms and about 1000 angstroms wide, although other widths may be used.

Figure 6D:
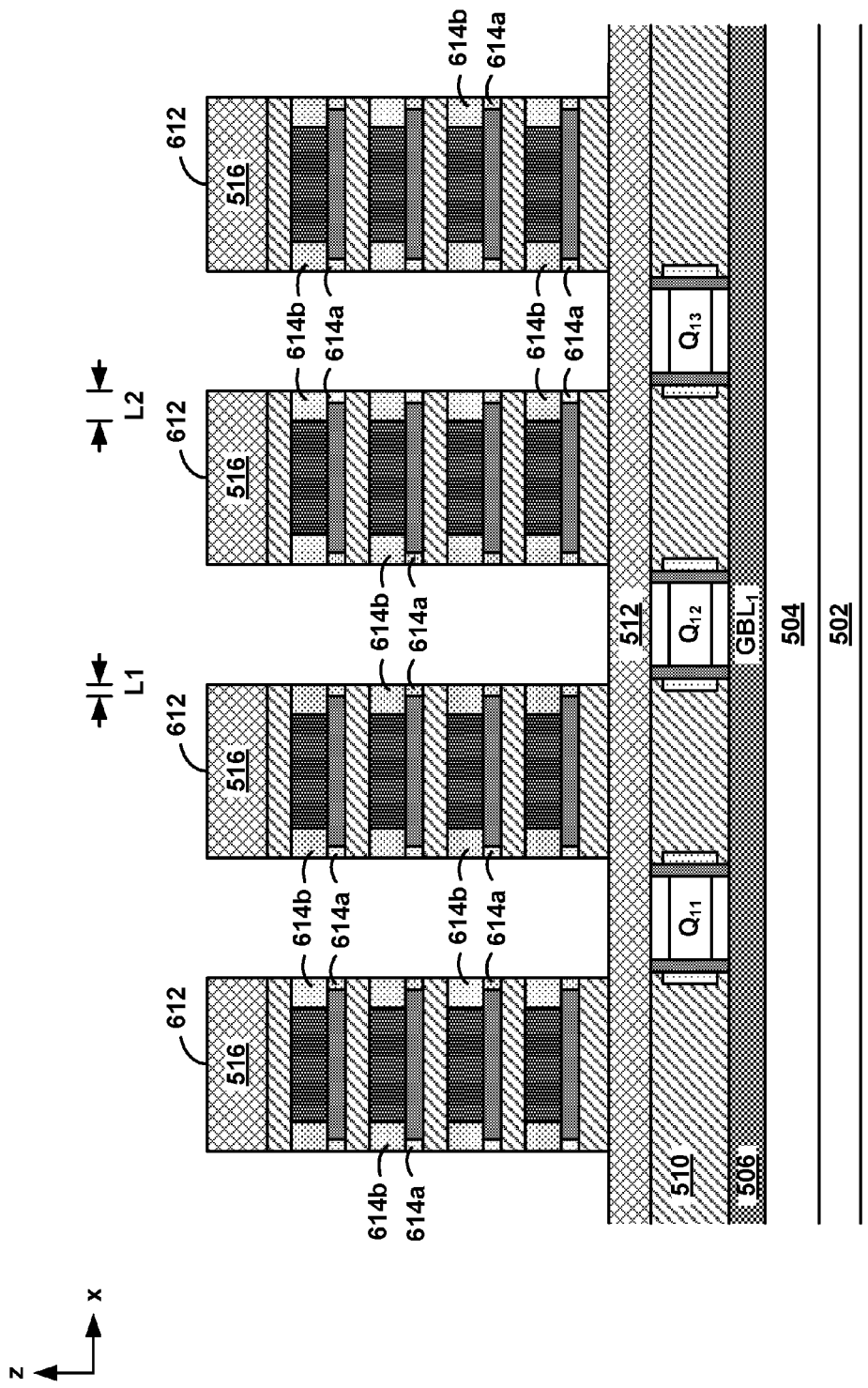

Exposed ends of first conductive material layers 610a and second conductive material layers 610b are then oxidized to form oxidized portions 614a of first conductive material layers 610a, and oxidized portions 614b of second conductive material layers 610b, resulting in the structure shown in FIG. 6D. In an embodiment, oxidation may be accomplished by annealing the structure shown in FIG. 6C in the presence of oxygen. Alternatively, oxidation may be a byproduct of the etch chemistry used to etch first conductive material layers 610a and second conductive material layers 610b Other oxidation techniques may be used.

Each of oxidized portions 614a of first conductive material layers 610a has a length L1, and each of oxidized portions 614b of second conductive material layers 610b has a length L2. Because second conductive material layers 610b oxidize at a faster rate than first conductive material layers 610a, L2 is greater than L1. In embodiments, length L1 may be between about 5 angstroms and about 10 angstroms, and length L2 may be between about 10 angstroms and about 20 angstroms, although other lengths may be used.

A nonvolatile memory material layer 518 is deposited conformally over rows 612. Non-volatile memory material 518 may include, for example, an oxide layer, a reversible resistance-switching material (e.g., a metal oxide layer such as nickel oxide, hafnium oxide, or other similar metal oxide material, a phase change material or other similar reversible resistance-switching material), or a charge trapping layer (e.g., a layer of silicon nitride).

For example, between about 20 angstroms to about 1000 angstroms of hafnium oxide ($HfO_2$) may be deposited. Other nonvolatile memory materials such as $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$, or other suitable nonvolatile memory materials, etc., and/or other nonvolatile memory material layer thicknesses may be used. Nonvolatile memory material layer 518 may be a single layer of a single nonvolatile memory material, or may be multiple layers of one or more nonvolatile memory materials.

Figure 6E:
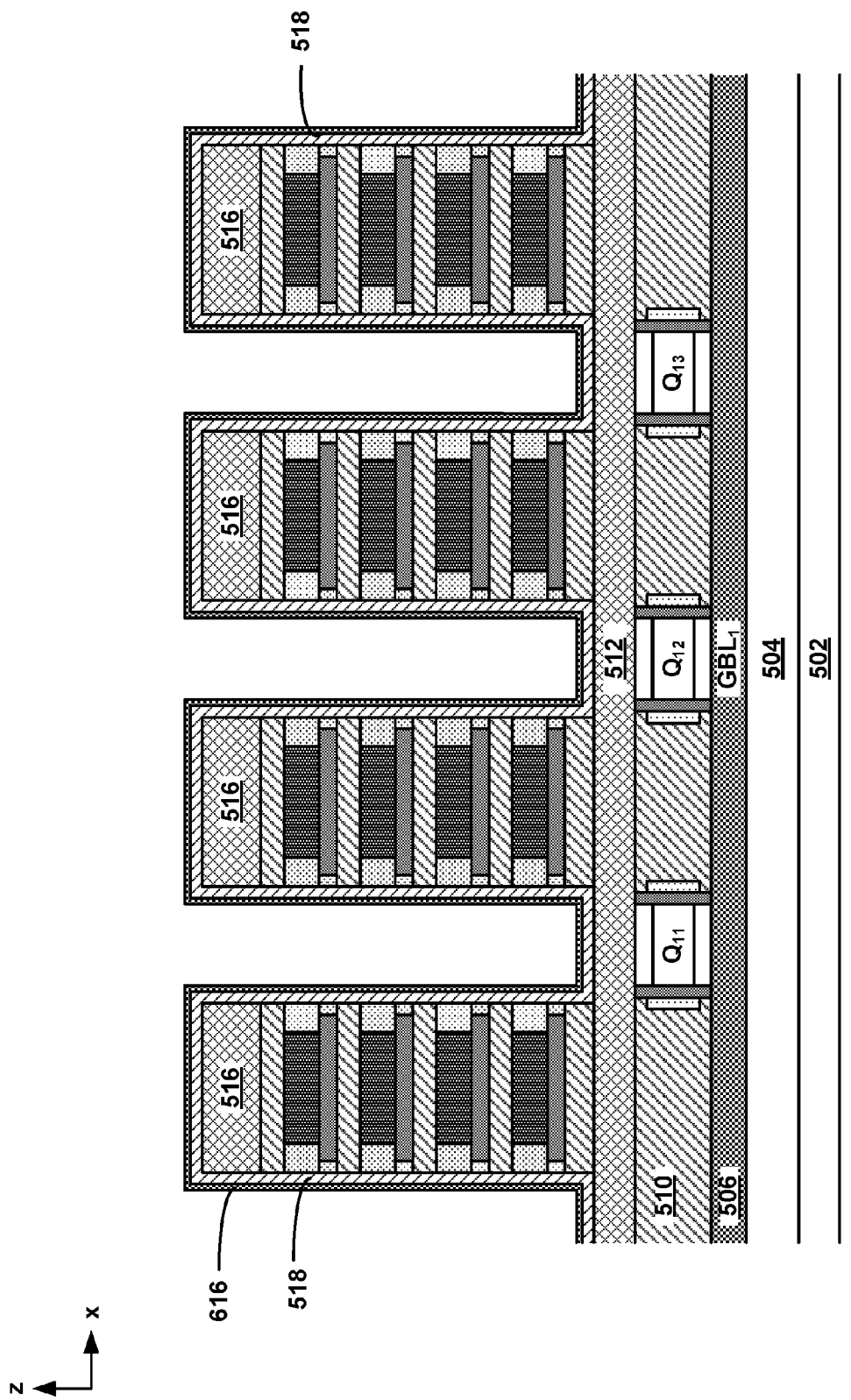

Next, a polysilicon material layer 616 is conformally deposited over nonvolatile memory material layer 518. For example, between about 10 angstroms to about 200 angstroms of polysilicon may be deposited on substrate 502, resulting in the structure shown in FIG. 6E. Other materials such n+ polysilicon, p+ polysilicon, and/or other dielectric material layer thicknesses may be used.

Figure 6F:
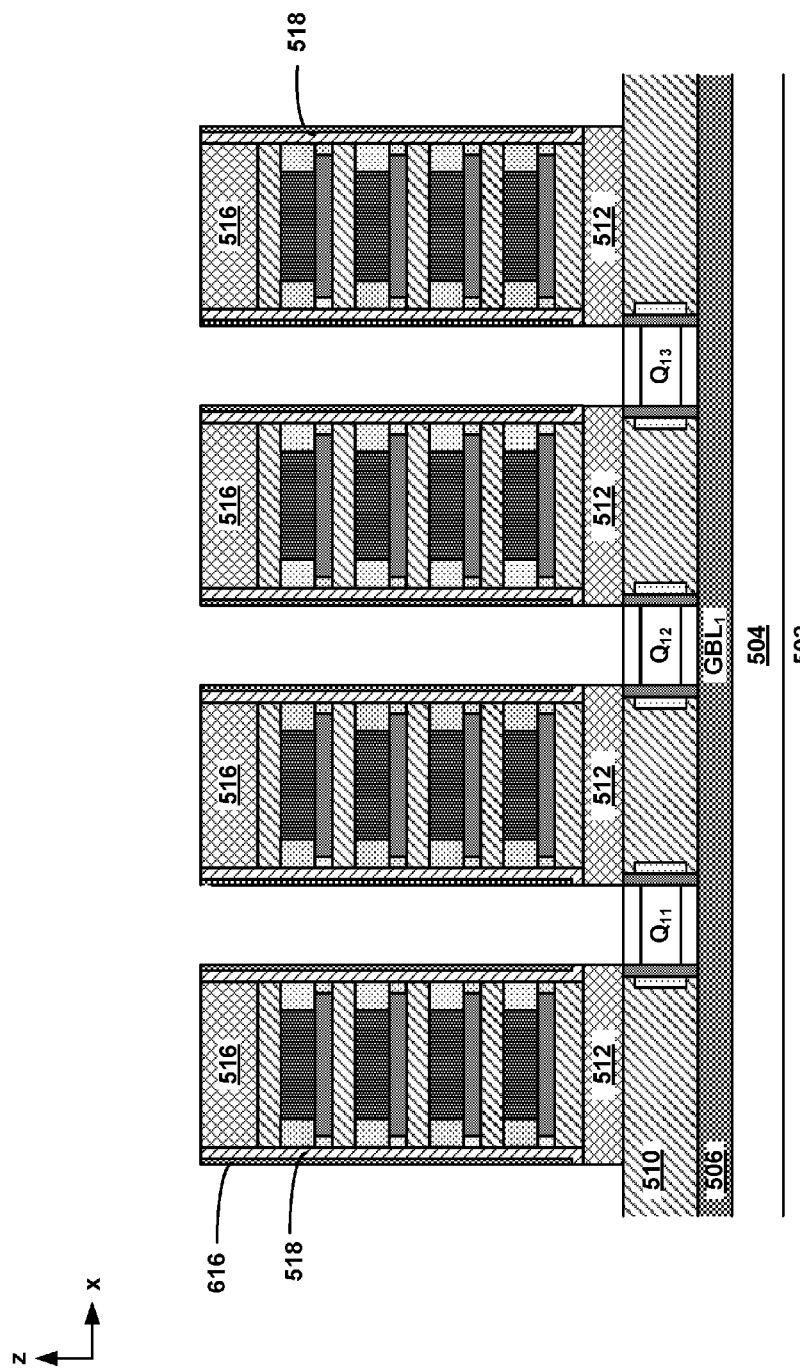

An anisotropic etch is used to remove lateral portions of polysilicon material layer 616, nonvolatile memory material layer 518 and first etch stop layer 512, leaving only sidewall portions of polysilicon material layer 616 and nonvolatile memory material layer 518, and exposing top surfaces of bit line select transistors $Q_{11}$-$Q_{31}$, resulting in the structure shown in FIG. 6F.

Figure 6G:
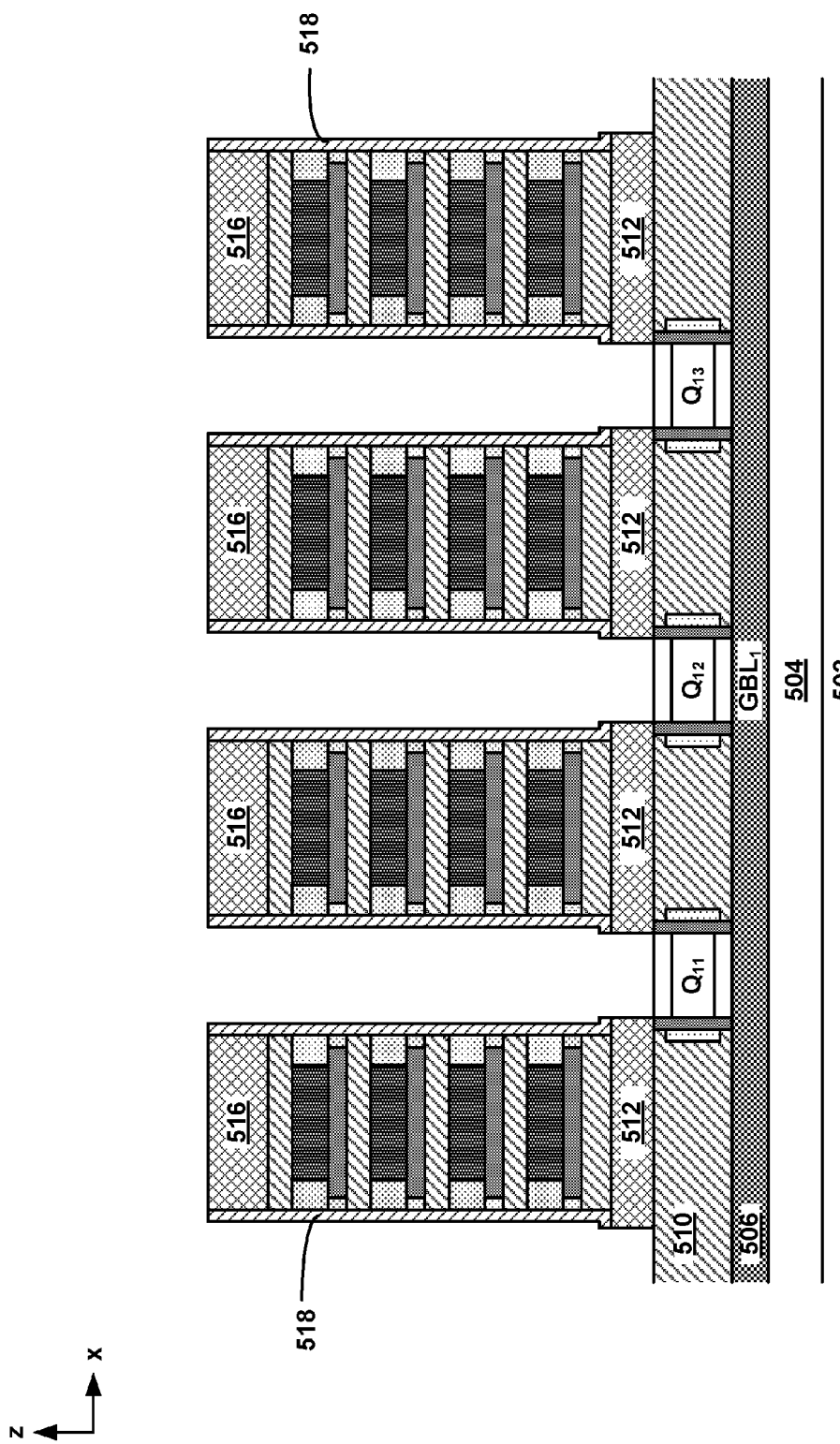

Next, polysilicon material layer 616 is removed, for example by a wet etch process, exposing nonvolatile memory material layer 518, and resulting in the structure shown in FIG. 6G.

A conductive material 618 is deposited over substrate 502 and then patterned and etched to form vertical bit lines $LBL_{11}$-$LBL_{33}$. For example, conductive material layer 618 may include any suitable conductive material such as heavily doped semiconductor material, tungsten or another appropriate metal, a conductive silicide, a conductive silicide-germanide, a conductive germanide, or the like deposited by any suitable method (e.g., CVD, PVD, etc.).

For example, approximately 1000 to about 5000 angstroms of heavily doped polysilicon may be deposited and planarized using chemical mechanical polishing or an etch-back process. Other conductive materials and/or thicknesses may be used. Conductive material 618 may then be patterned and etched to form vertical bit lines $LBL_{11}$-$LBL_{33}$. A dielectric material 524, such as silicon dioxide, may then be deposited over substrate 502, filling the voids between vertical bit lines $LBL_{11}$-$LBL_{33}$, and then planarized using chemical mechanical polishing or an etch-back process, resulting in the structure shown in FIGS. 6H1-6H3.

Figure 7A:
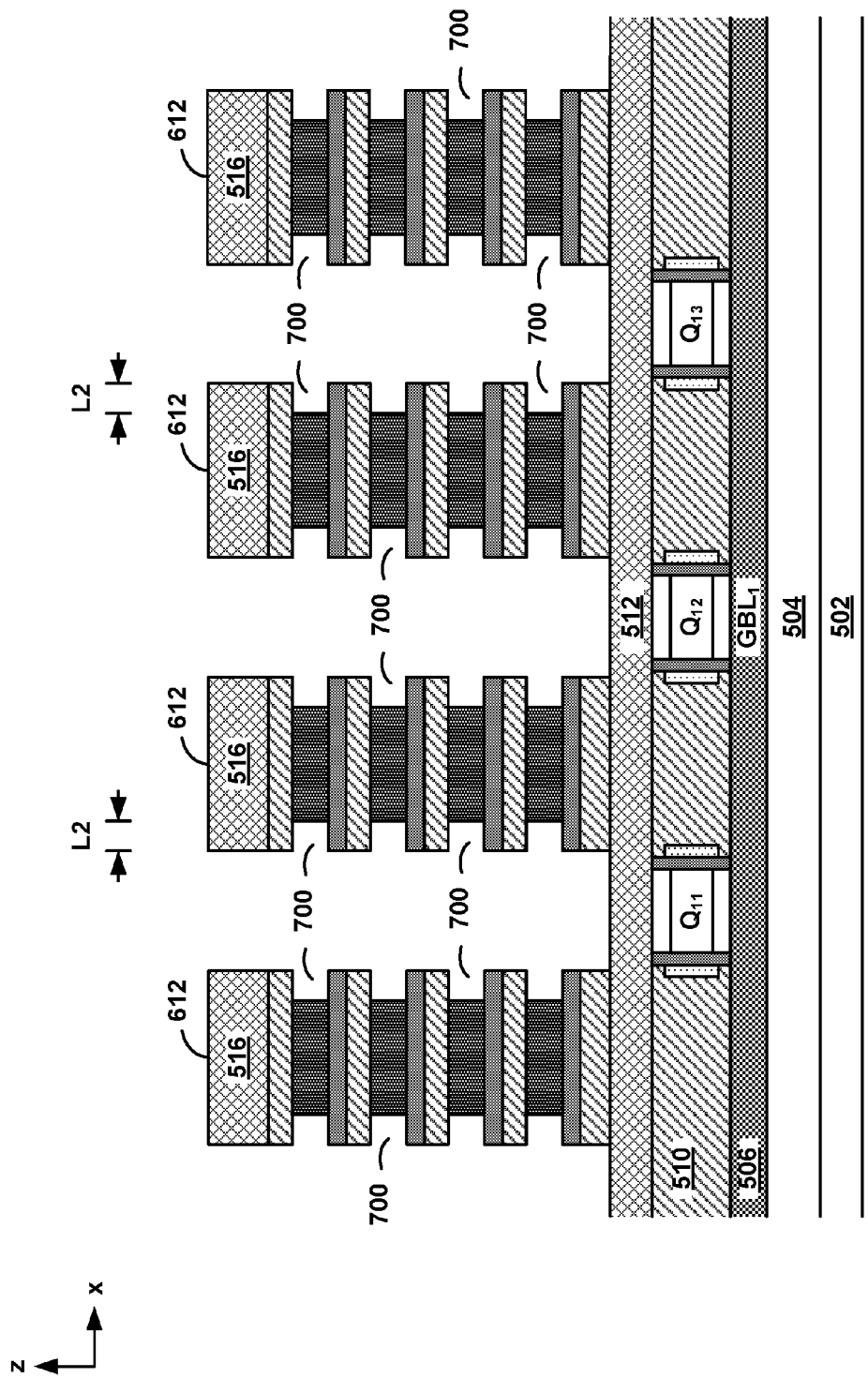
FIGS. 7A-7C are cross-sectional views of a portion of a substrate during an example alternative fabrication of the monolithic three-dimensional memory array of FIGS. 5A-5F.
Figure 7B:
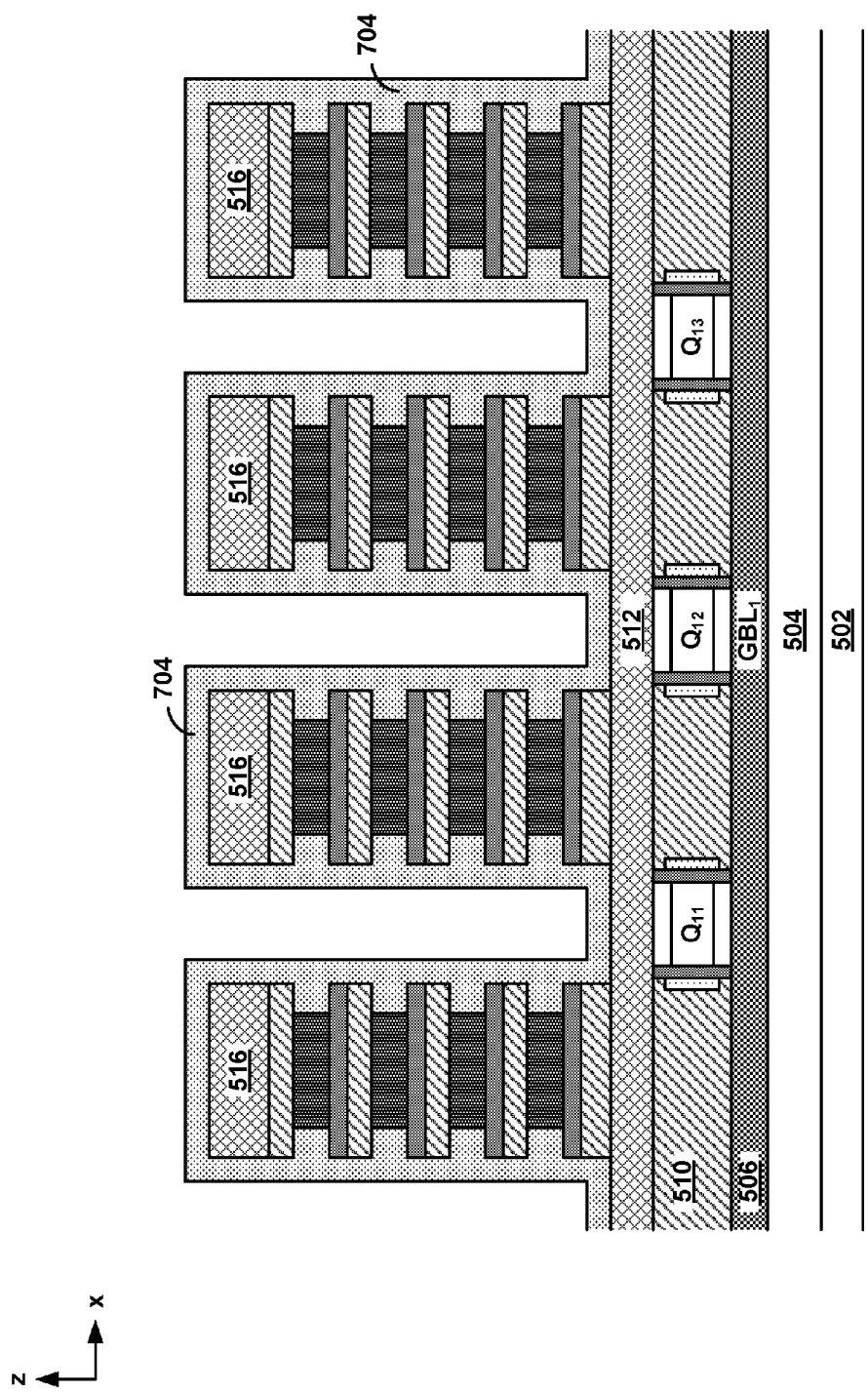
Figure 7C:
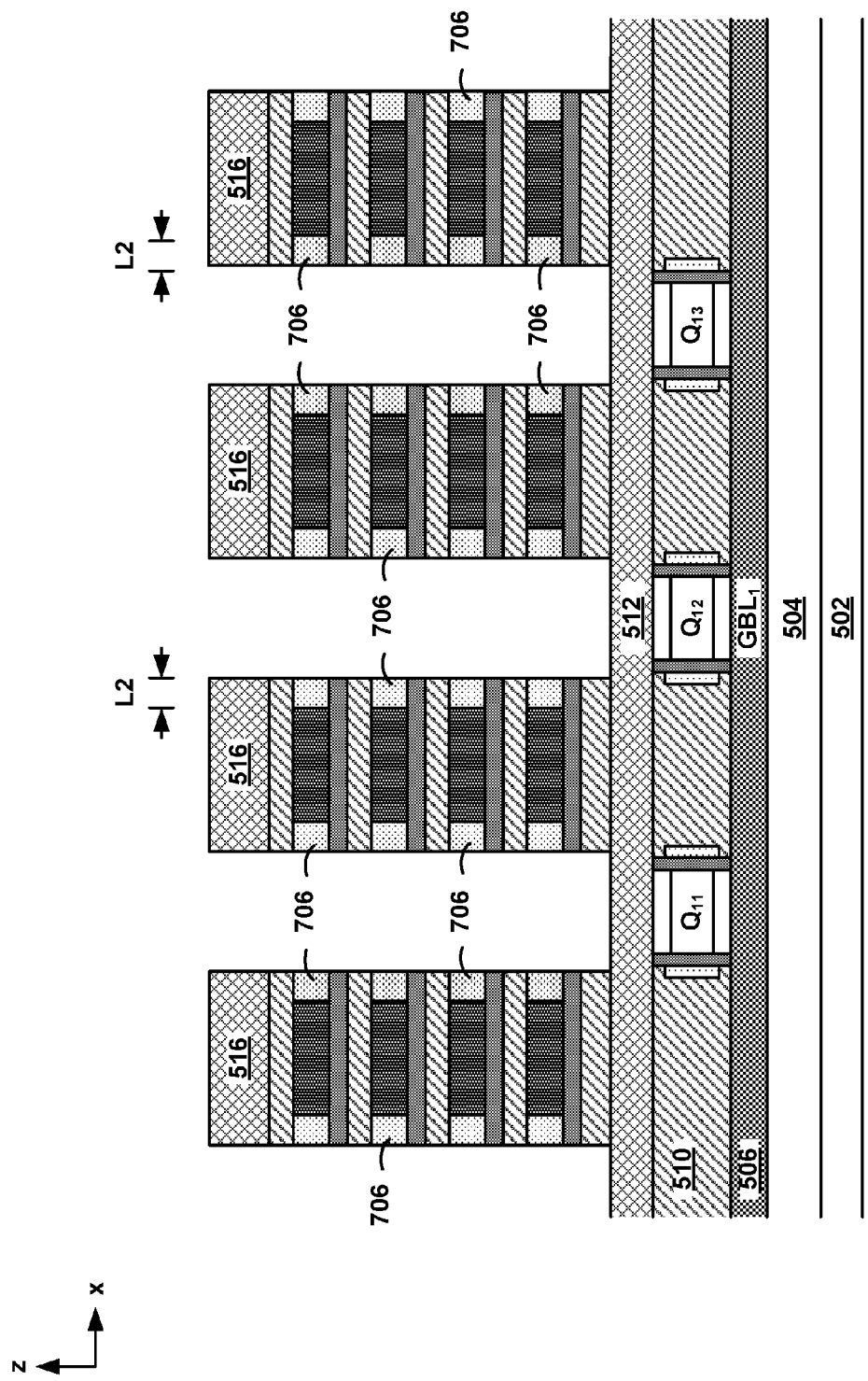

In the process described above, the structure of FIG. 6C is oxidized to form oxidized portions 614a of first conductive material layers 610a, and oxidized portions 614b of second conductive material layers 610b. FIGS. 7A-7C describe an alternative process that uses etching to form first and second portions of second conductive material layers 610b.

In particular, second conductive material layers 610b in the structure of FIG. 6C may be etched (e.g., using a dry etch process) to form voids 702 at ends of second conductive material layers 610b, resulting in the structure shown in FIG. 7A. Each of voids 702 may have a length L2 between about 10 angstroms and about 60 angstroms, although other lengths may be used.

A dielectric material layer 704 is deposited conformally over substrate 502, filling voids 702 and forming on sidewalls of rows 612 of multi-layer word lines $WL_{10}$, $WL_{11}$, ..., $WL_{43}$, resulting in the structure shown in FIG. 7B. For example, between about 30 angstroms to about 100 angstroms of tantalum oxynitride may be deposited. Other dielectric materials such as silicon nitride, silicon oxynitride, low K dielectrics, etc., and/or other dielectric material layer thicknesses may be used.

An isotropic etch is used to remove lateral and sidewall portions of dielectric material layer 704, leaving only portions 706 of dielectric material layer in voids 702, resulting in the structure shown in FIG. 7C. Portions 706 each have a length L2, and correspond to oxidized portions 614b of second conductive material layers 610b of FIG. 6D.

Figure 8A:
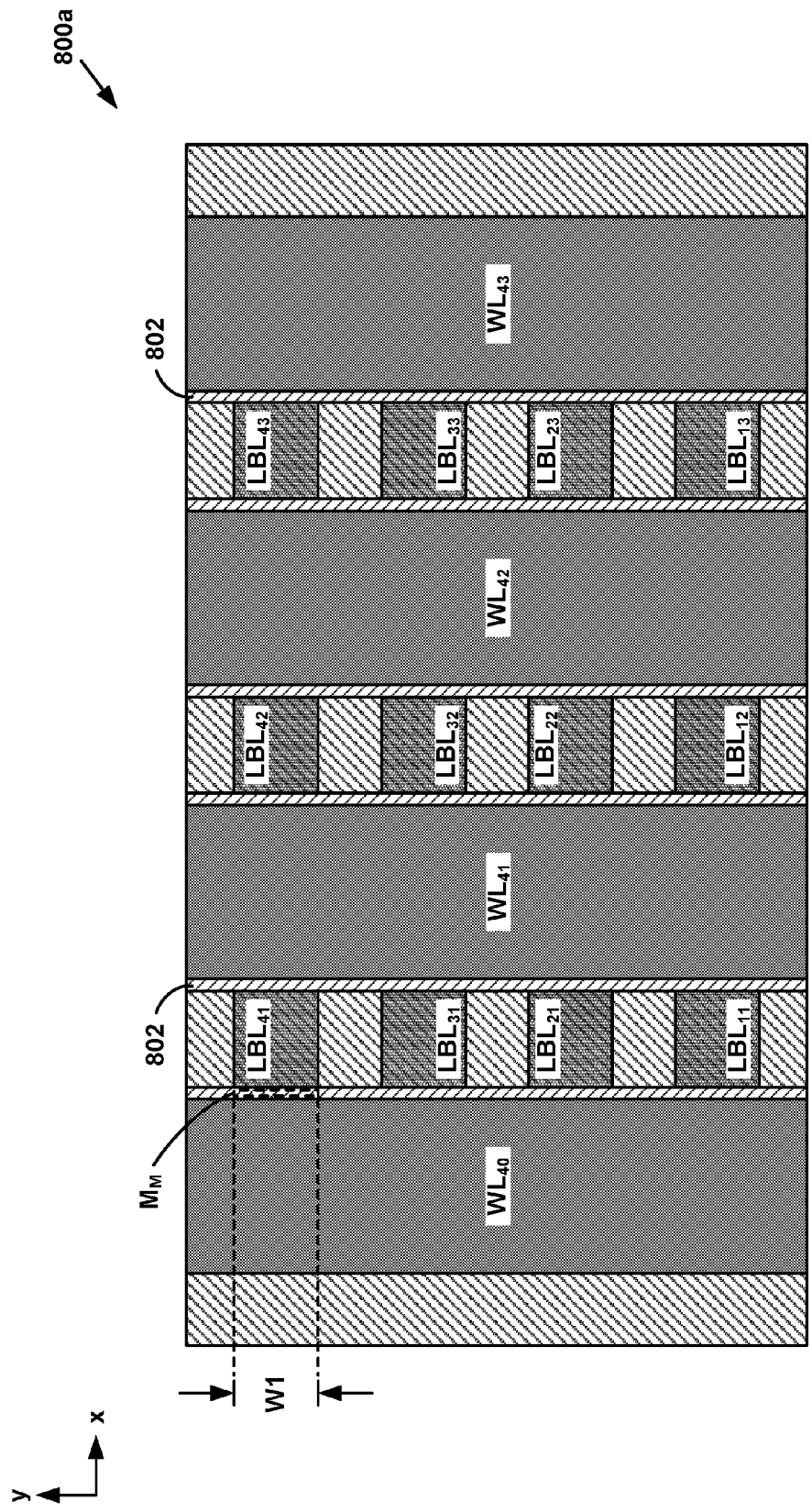
FIGS. 8A-8C depict views of portions of monolithic three-dimensional memory arrays.
Figure 8B:
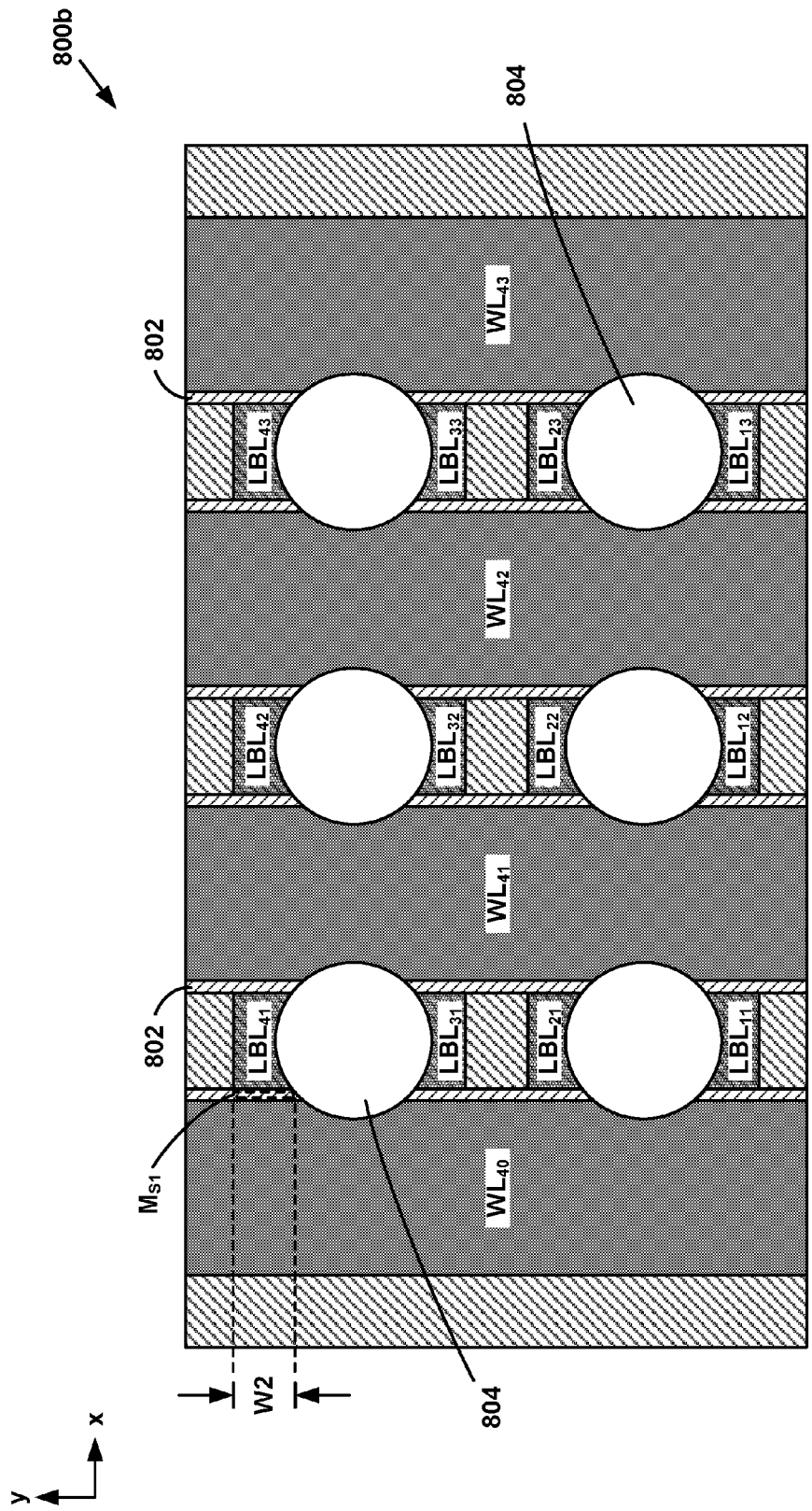
Figure 8C:
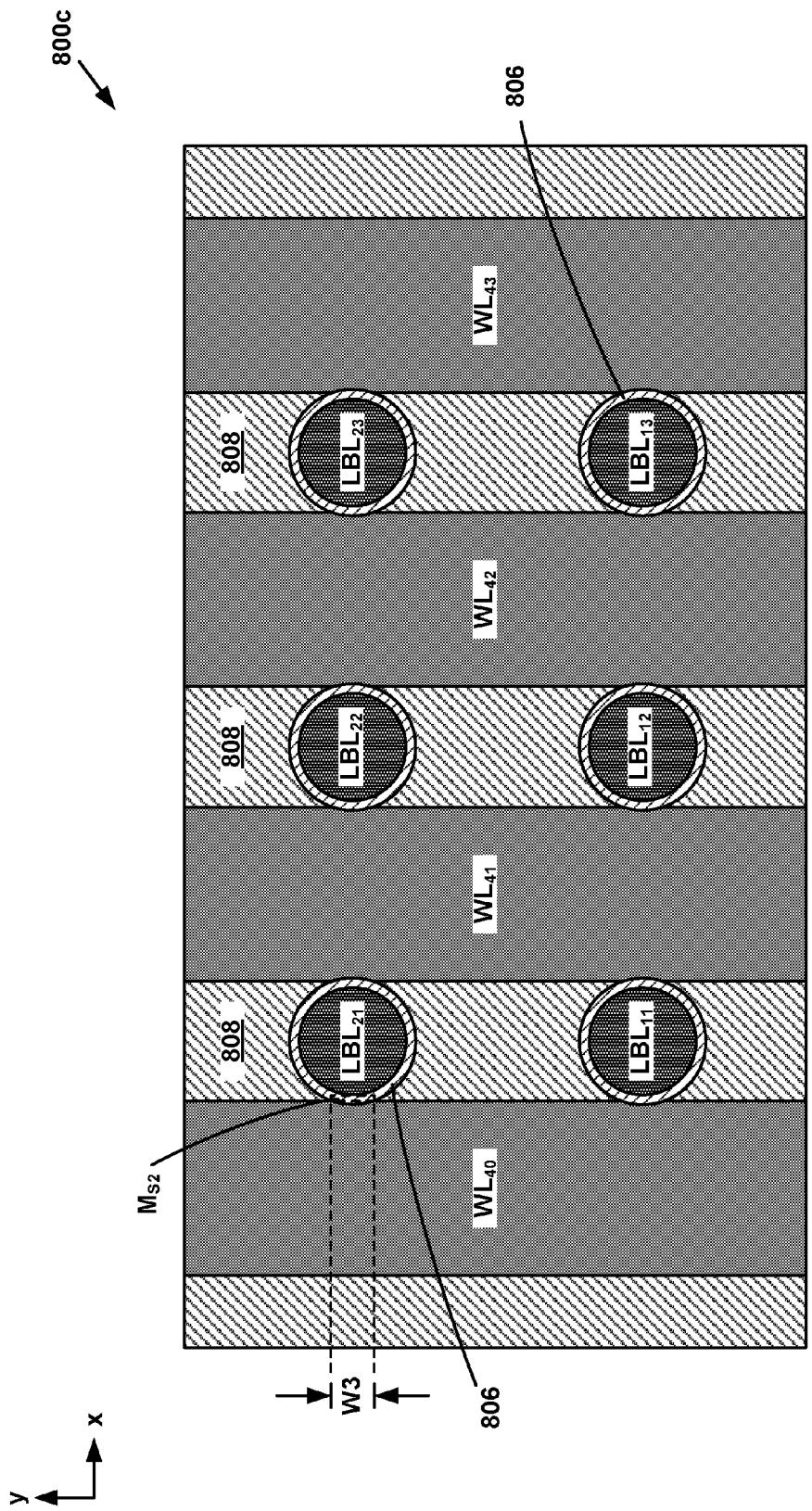

The technology described above controlled memory cell height. Technology also is described for controlling memory cell width. In particular, FIGS. 8A-8C depict top views of embodiments of a portion of monolithic three-dimensional memory array that include vertical strips of a non-volatile memory material. The physical structures depicted in FIGS. 8A-8C may include implementations for a portion of the monolithic three-dimensional memory array depicted in FIG. 2A.

In particular, FIG. 8A depicts a top view of a portion of a monolithic three-dimensional memory array 800a. Monolithic three-dimensional memory array 800a includes a stack of word lines $WL_{10}$, $WL_{11}$, ..., $WL_{43}$ with a dielectric material layer (e.g., silicon dioxide) separating adjacent word lines. Visible in FIG. 8A are word lines $WL_{40}$, $WL_{41}$, $WL_{42}$ and $WL_{43}$, vertical bit lines $LBL_{11}$-$LBL_{43}$, and vertical strips of non-volatile memory material 802. Word lines $WL_{40}$, $WL_{41}$, $WL_{42}$ and $WL_{43}$ may be single layer word lines or multi-layer word lines, such as described above in connection with FIGS. 4A-6H3. Each vertical strip of non-volatile memory material 802 may include, for example, a vertical oxide layer, a vertical reversible resistance-switching material (e.g., a metal oxide layer such as nickel oxide, hafnium oxide, or other similar metal oxide material, a phase change material or other similar reversible resistance-switching material), a vertical charge trapping layer (e.g., a layer of silicon nitride), or other non-volatile memory material.

Memory cells, such as memory cell $M_M$, are disposed between word lines $WL_{40}$, $WL_{41}$, $WL_{42}$ and $WL_{43}$ and vertical bit lines $LBL_{11}$-$LBL_{43}$. Each memory cell has a first width W1 (e.g., in the y-direction) substantially equal to a width of each of vertical bit lines $LBL_{11}$-$LBL_{43}$.

FIG. 8B depicts a top view of a portion of a monolithic three-dimensional memory array 800b. Monolithic three-dimensional memory array 800b includes a stack of word lines $WL_{10}$, $WL_{11}$, ..., $WL_{43}$ with a dielectric material layer (e.g., silicon dioxide) separating adjacent word lines. Visible in FIG. 8B are word lines $WL_{40}$, $WL_{41}$, $WL_{42}$ and $WL_{43}$, vertical bit lines $LBL_{11}$-$LBL_{43}$, and vertical strips of non-volatile memory material 802. Word lines $WL_{40}$, $WL_{41}$, $WL_{42}$ and $WL_{43}$ may be single layer word lines or multi-layer word lines.

In addition, monolithic three-dimensional memory array 800b includes vertical holes 804 that extend through the stack of word lines $WL_{10}$, $WL_{11}$, ..., $WL_{43}$. Vertical holes 804 may be filled with a dielectric material, such as silicon dioxide or other dielectric material (not shown). Vertical holes 804 may be formed by patterning and etching holes in a monolithic three-dimensional memory array, such as monolithic three-dimensional memory array 800a of FIG. 8A. As a result of such hole formation, a portion of each of vertical bit lines $LBL_{11}$-$LBL_{43}$ is removed, and a width of each of vertical bit lines $LBL_{11}$-$LBL_{43}$ at an interface with the adjacent vertical strip of non-volatile memory material 802 is reduced.

Memory cells, such as memory cell $M_{S1}$, are disposed between word lines $WL_{40}$, $WL_{41}$, $WL_{42}$ and $WL_{43}$ and vertical bit lines $LBL_{11}$-$LBL_{43}$. Each memory cell has a second width W2 (e.g., in the y-direction) substantially equal to a width of each of vertical bit lines $LBL_{11}$-$LBL_{43}$ at the interface of the vertical bit line and the vertical strip of non-volatile memory material 802. Because a portion of each of vertical bit lines $LBL_{11}$-$LBL_{43}$ has been removed as a result of the formation of vertical holes 804, second width W2 is less than first width W1 of FIG. 8A.

Thus, memory cells, such as memory cell $M_{S1}$, of monolithic three-dimensional memory array 800b of FIG. 8B have a smaller width (and hence a smaller working area and working volume) than memory cells, such as memory cell $M_M$, of monolithic three-dimensional memory array 800a of FIG. 8A.

FIG. 8C depicts a top view of a portion of a monolithic three-dimensional memory array 800c. Monolithic three-dimensional memory array 800c includes a stack of word lines $WL_{10}$, $WL_{11}$, ..., $WL_{43}$ with a dielectric material layer (e.g., silicon dioxide) separating adjacent word lines. Visible in FIG. 8C are word lines $WL_{40}$, $WL_{41}$, $WL_{42}$ and $WL_{43}$, vertical bit lines $LBL_{11}$-$LBL_{23}$, and vertical strips of non-volatile memory material 806. Each of word lines $WL_{40}$, $WL_{41}$, $WL_{42}$ and $WL_{43}$ may be single layer word lines or multi-layer word lines. A dielectric material 808 (e.g., silicon dioxide) separates adjacent stacks of word lines $WL_{10}$, $WL_{11}$, ..., $WL_{43}$.

Each of vertical bit lines $LBL_{11}$-$LBL_{23}$ has a shape of a cylindrical pillar, with a vertical strip of non-volatile memory material 806 disposed on an exterior surface of the pillar. Vertical bit lines $LBL_{11}$-$LBL_{23}$ and vertical strips of non-volatile memory material 806 may be formed by patterning and etching vertical holes through dielectric material 808 between adjacent stacks of word lines $WL_{10}$, $WL_{11}$, ..., $WL_{43}$. Non-volatile memory material may be formed on sidewalls of the vertical holes to form vertical strips of non-volatile memory material 806. A conductive material (e.g., a highly doped polysilicon material or other conductive material may be deposited to fill the remaining opening in the vertical holes to form vertical bit lines $LBL_{11}$-$LBL_{23}$.

Each vertical strip of non-volatile memory material 806 may include, for example, a vertical oxide layer, a vertical reversible resistance-switching material (e.g., a metal oxide layer such as nickel oxide, hafnium oxide, or other similar metal oxide material, a phase change material or other similar reversible resistance-switching material), a vertical charge trapping layer (e.g., a layer of silicon nitride), or other non-volatile memory material.

Memory cells, such as memory cell $M_{S2}$, are disposed between word lines $WL_{40}$, $WL_{41}$, $WL_{42}$ and $WL_{43}$ and vertical bit lines $LBL_{11}$-$LBL_{23}$. Each memory cell has a third width W3 (e.g., in the y-direction) substantially equal to a width of an interface region between the word line and the vertical strip of non-volatile memory material 806. Because the interface region is small, third width W3 is less than first width W1 of FIG. 8A.

Thus, memory cells, such as memory cell $M_{S2}$, of monolithic three-dimensional memory array 800c of FIG. 8C have a smaller width (and hence a smaller working area and working volume) than memory cells, such as memory cell $M_M$, of monolithic three-dimensional memory array 800a of FIG. 8A.

Thus, as described above, one embodiment of the disclosed technology includes a method that includes forming a vertical bit line disposed in a first direction above a substrate, forming a multi-layer word line disposed in a second direction above the substrate, the second direction perpendicular to the first direction, and forming a memory cell including a nonvolatile memory material at an intersection of the vertical bit line and the multi-layer word line. The multi-layer word line includes a first conductive material layer and a second conductive material layer disposed above the first conductive material layer. The memory cell includes a working cell area encompassed by an intersection of the first conductive material layer and the nonvolatile memory material One embodiment of the disclosed technology includes a method including forming a vertical bit line disposed above a substrate, forming a multi-layer word line above the substrate, and forming a memory cell including a nonvolatile memory material disposed between the vertical bit line and the multi-layer word line. The multi-layer word line includes a first conductive material layer and a second conductive material layer disposed above the first conductive material layer. The memory cell includes a height substantially equal to a first height of the first conductive material layer.

One embodiment of the disclosed technology includes a method that includes forming a vertical bit line disposed in a first direction above a substrate, forming a word line disposed in a second direction above the substrate, the second direction perpendicular to the first direction, forming a nonvolatile memory material between the vertical bit line and the word line, and reducing a width of the vertical bit line at an interface with the non-volatile memory material.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
forming a vertical bit line disposed in a first direction above a substrate;
forming a multi-layer word line disposed in a second direction above the substrate, the second direction perpendicular to the first direction; and
forming a memory cell comprising a nonvolatile memory material at an intersection of the vertical bit line and the multi-layer word line,
wherein:
the multi-layer word line comprises a first conductive material layer and a second conductive material layer disposed above the first conductive material layer;
the memory cell comprises a working cell area encompassed by an intersection of the first conductive material layer and the nonvolatile memory material and
the first conductive material layer comprises a first oxidation rate, and the second conductive material layer comprises a second oxidation rate greater than the first oxidation rate.

2. The method of claim 1, wherein the first conductive material comprises a first height, and the second conductive material comprises a second height greater than the first height.

3. The method of claim 1, wherein forming the multi-layer word line comprises:
forming the first conductive material layer;
forming the second conductive material layer above the first conductive material layer; and
oxidizing an exposed end of the second conductive material layer.

4. The method of claim 3, further comprising oxidizing an exposed end of the first conductive material layer.

5. The method of claim 1, wherein forming the multi-layer word line comprises:
forming the first conductive material layer;
forming the second conductive material layer above the first conductive material layer;
forming a void at an end of the second conductive material layer.

6. The method of claim 5, further comprising filling the void with a dielectric material.

7. The method of claim 6, wherein the dielectric material comprises an oxide of the second conductive material layer.

8. The method of claim 1, wherein the nonvolatile memory material comprises one of a reversible resistance-switching material, a phase change material, and a charge trapping layer.

9. The method of claim 1, wherein the nonvolatile memory material comprise one or more of $HfO_2$, $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, $SrTiO_3$.

10. The method of claim 1, wherein forming the multi-layer word line comprises:
forming the first conductive material layer; and
forming the second conductive material layer above the first conductive material layer, the second conductive material layer comprising a first portion and a second portion.

11. The method of claim 10, wherein forming the second conductive material layer comprises forming the second portion of the second conductive material layer at a tip of the second conductive material layer.

12. The method of claim 10, wherein the first conductive material layer comprises a first sheet resistance RS1, and the first portion of the second conductive material layer has a second sheet resistance RS2, with RS2<<RS1.

13. The method of claim 1, wherein forming the multi-layer word line comprises:
forming the first conductive material layer, the first conductive material layer comprising a first portion and a second portion; and
forming the second conductive material layer above the first conductive material layer, the second conductive material layer comprising a first portion and a second portion.

14. The method of claim 13, wherein:
forming the first conductive material layer comprises forming the second portion of the first conductive material layer at a tip of the first conductive material layer; and
forming the second conductive material layer comprises forming the second portion of the second conductive material layer at a tip of the second conductive material layer.

15. The method of claim 13, wherein:
the second portion of the first conductive material layer comprises an oxide of the first portion of the first conductive material layer; and
the second portion of the second conductive material layer comprises an oxide of the first portion of the second conductive material layer.

16. The method of claim 1, wherein forming the multi-layer word line comprises:
forming a third conductive material layer, the third conductive material layer comprising a first portion and a second portion;
forming the first conductive material layer above the third conductive material layer, the first conductive material layer comprising a first portion and a second portion; and
forming the second conductive material layer above the first conductive material layer, the second conductive material layer comprising a first portion and a second portion.

17. The method of claim 16, wherein:
the second portion of the first conductive material layer comprises an oxide of the first portion of the first conductive material layer;

the second portion of the second conductive material layer comprises an oxide of the first portion of the second conductive material layer; and the second portion of the third conductive material layer comprises an oxide of the first portion of the third conductive material layer.

\* \* \* \* \*